United States Patent [19]

Suzuki et al.

[11] Patent Number: 5,220,377
[45] Date of Patent: Jun. 15, 1993

[54] IMAGE RECORDING APPARATUS

[75] Inventors: Tsutomu Suzuki, Nagoya; Shigeyuki Hayashi, Gifu; Takeshi Izaki, Nagoya; Yoshiya Tomatsu, Aichi, all of Japan

[73] Assignee: Brother Kogyo Kabushiki Kaisha, Nagoya, Japan

[21] Appl. No.: 889,931

[22] Filed: Jun. 2, 1992

[30] Foreign Application Priority Data

Jun. 5, 1991 [JP] Japan .................... 3-162192

[51] Int. Cl.⁵ .......................................... G03B 27/52
[52] U.S. Cl. .................................................. 355/27
[58] Field of Search .............. 355/27, 77; 430/202, 430/138, 271, 253, 7; 354/301

[56] References Cited

U.S. PATENT DOCUMENTS 4,912,014 3/1990 Feldman ............... 430/202
5,099,273 3/1992 Yamamoto et al. ............. 355/27

FOREIGN PATENT DOCUMENTS 61-275742 12/1986 Japan .
62-147461 7/1987 Japan .

Primary Examiner—Richard A. Wintercorn
Attorney, Agent, or Firm—Kane, Dalsimer, Sullivan, Kurucz, Levy, Eisele and Richard

[57] ABSTRACT

An image recording apparatus for recording an image on an image receiving sheet with use of a photosensitive microcapsule sheet on which microcapsules being photohardenable upon exposure and being hardened by heating are applied, is disclosed.

The image recording apparatus comprises an exposing means for rendering the microcapsules hardenable upon exposure thereby, a heating means for forming a latent image on the photosensitive sheet by heating the exposed hardenable microcapsules, a feeding means for feeding the photosensitive sheet to the image receiving sheet through a feeding path and a pressure means for transferring the latent image on the image receiving sheet by pressurizing both photosensitive sheet and the image receiving sheet in superposing the sheets.

In such the image recording apparatus, the feeding means is located downstream the heating means on the feeding path.

According to the image recording apparatus, since the feeding means is arranged downstream the heating means on the feeding path in the present invention, the microcapsules on the photosensitive sheet are never unnecessarily ruptured by the feeding means before the exposed photosensitive sheet is heated by the heating means. Accordingly, the image with good quality can be formed on the image receiving sheet without injuring the formed image to unnecessarily rupture the microcapsules applied on the photosensitive sheet.

36 Claims, 22 Drawing Sheets

F I G. 1 4
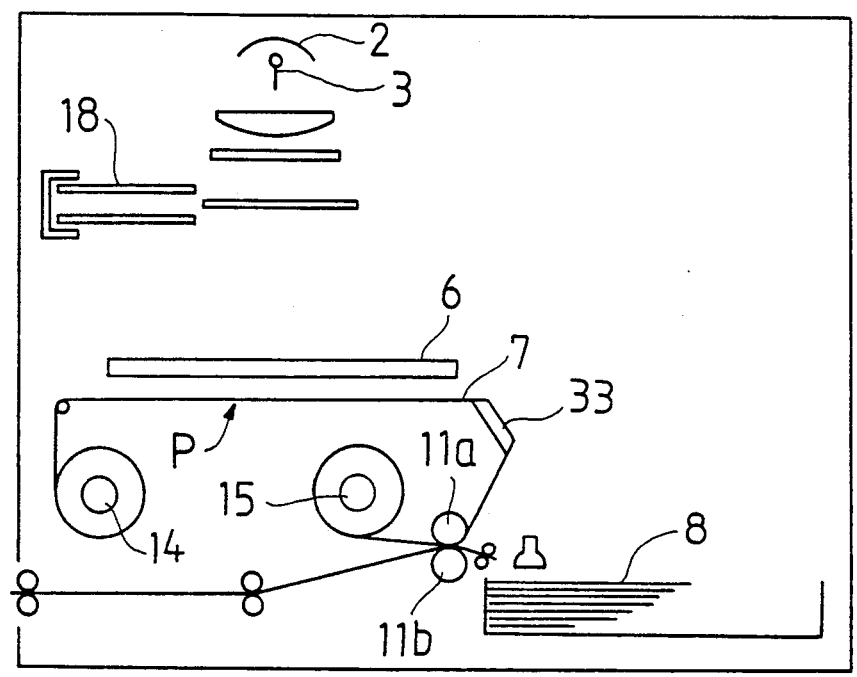
F I G. 1 5
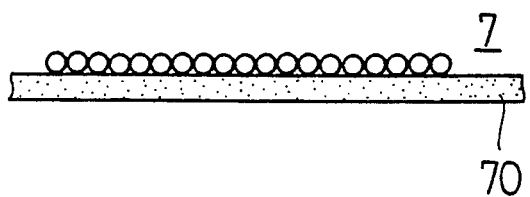

IMAGE RECORDING APPARATUS

BACKGROUND OF THE INVENTION

1. Field of the Invention

The present invention relates to an image recording apparatus forming an image corresponding to an image information input from an external apparatus on a receiving sheet by pressing the receiving sheet and an exposed photosensitive sheet on which a latent image of the image corresponding to the external image information is formed, in superposing both sheets each other, and particularly to the image recording apparatus in which a feeding device for feeding the photosensitive sheet is located downstream a heating device used when the latent image is formed on the photosensitive sheet.

2. Description of the Related Art

Conventionally, this kind of the image recording apparatus is variously proposed. For example, in Japanese Patent Laid-Open No. Sho 62-147461, an image recording apparatus in which an image according to a latent image formed on a photosensitive sheet by exposing and heating thereof is recorded on a receiving sheet having an absorbent thereon by pressing both the sheets superposed mutually. Here, the photosensitive sheet has thereon microcapsules in which a coloring agent is encapsulated. The microcapsules are rendered photohadenable by exposing and hardened by heating. And when the image is formed on the receiving sheet, the coloring agent flown out of the non-exposed microcapsules reacts with the absorbent of the receiving sheet.

In the above recording apparatus, a feeding device for the photosensitive sheet having a pair of feeding rollers, etc. is arranged on a feeding path. And that feeding device is located upstream a heating device used for heating the photosensitive sheet to form the latent image thereon, according to the feeding path. Thus, in the apparatus, the exposed photosensitive sheet is fed by the feeding device before reaching to the heating device.

However, in case that the exposed photosensitive sheet before being heated is fed by the feeding rollers in nipping the photosensitive sheet therebetween, the microcapsules applied on the photosensitive sheet will be unnecessarily ruptured. In that case, a flaw and the like is formed in the recorded image on the receiving sheet because of such unnecessary rupturing of the microcapsules, as a result, quality of the recorded image remarkably goes down.

SUMMARY OF THE INVENTION

Therefore, this invention is accomplished to dissolve above mentioned problem of the related art and it is an object of the present invention to provide an image recording apparatus in which the microcapsules on the photosensitive sheet are not unnecessarily ruptured by the feeding device while feeding the exposed photosensitive sheet to the heating device.

To achieve this object, the image recording apparatus of the present invention records an image on an image receiving sheet with use of photosensitive microcapsules being photohardenable upon exposure and being hardened by heating, the image recording apparatus comprising an exposing means for rendering the microcapsules applied on a photosensitive sheet hardenable upon exposing thereby, a heating means for forming a latent image on the photosensitive sheet by heating the hardenable microcapsules to be hardened, a feeding means for feeding the photosensitive sheet to the image receiving sheet through a feeding path, a pressure means for developing the latent image on the image receiving sheet by pressurizing both the photosensitive sheet and the image receiving sheet in superposing the sheets each other, wherein the feeding means is located downstream the heating means on the feeding path.

According to the image recording apparatus of the present invention, the photosensitive sheet is exposed by the exposing means and the exposed microcapsules are rendered hardenable. Thereafter, the photosensitive sheet is fed by the feeding means located downstream the heating means. At this time, the non-exposed microcapsules are not unnecessarily ruptured before heating of the photosensitive sheet because the feeding means is located downstream the heating means. And at the heating means, only the exposed microcapsules are hardened so that the latent image is formed on the photosensitive sheet. Further, the heated photosensitive sheet is fed to the pressure means by the feeding means and the latent image is developed on the image receiving sheet by the pressure means.

Therefore, since the feeding means is arranged downstream the heating means on the feeding path in the present invention, the microcapsules on the photosensitive sheet are never unnecessarily ruptured by the feeding means before the exposed photosensitive sheet is heated by the heating means. Accordingly, the image with good quality can be formed on the image receiving sheet without injuring the formed image to unnecessarily rupture the microcapsules applied on the photosensitive sheet.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention.

In the drawings,

FIG. 14 is a whole schematic view of the apparatus of the present invention, in which a heater having a plurality of heating elements arranged in a line state with right angles to a feeding path of the microcapsule sheet is utilized, FIG. 15 is a sectional view of the microcapsule sheet that the microcapsules are applied on a one side of a conductive base film sheet.

DETAILED DESCRIPTION OF PREFERRED EMBODIMENTS

A detailed description of the first preferred embodiment of an image recording apparatus will be given referring to the accompanying drawings.

Figure 1:
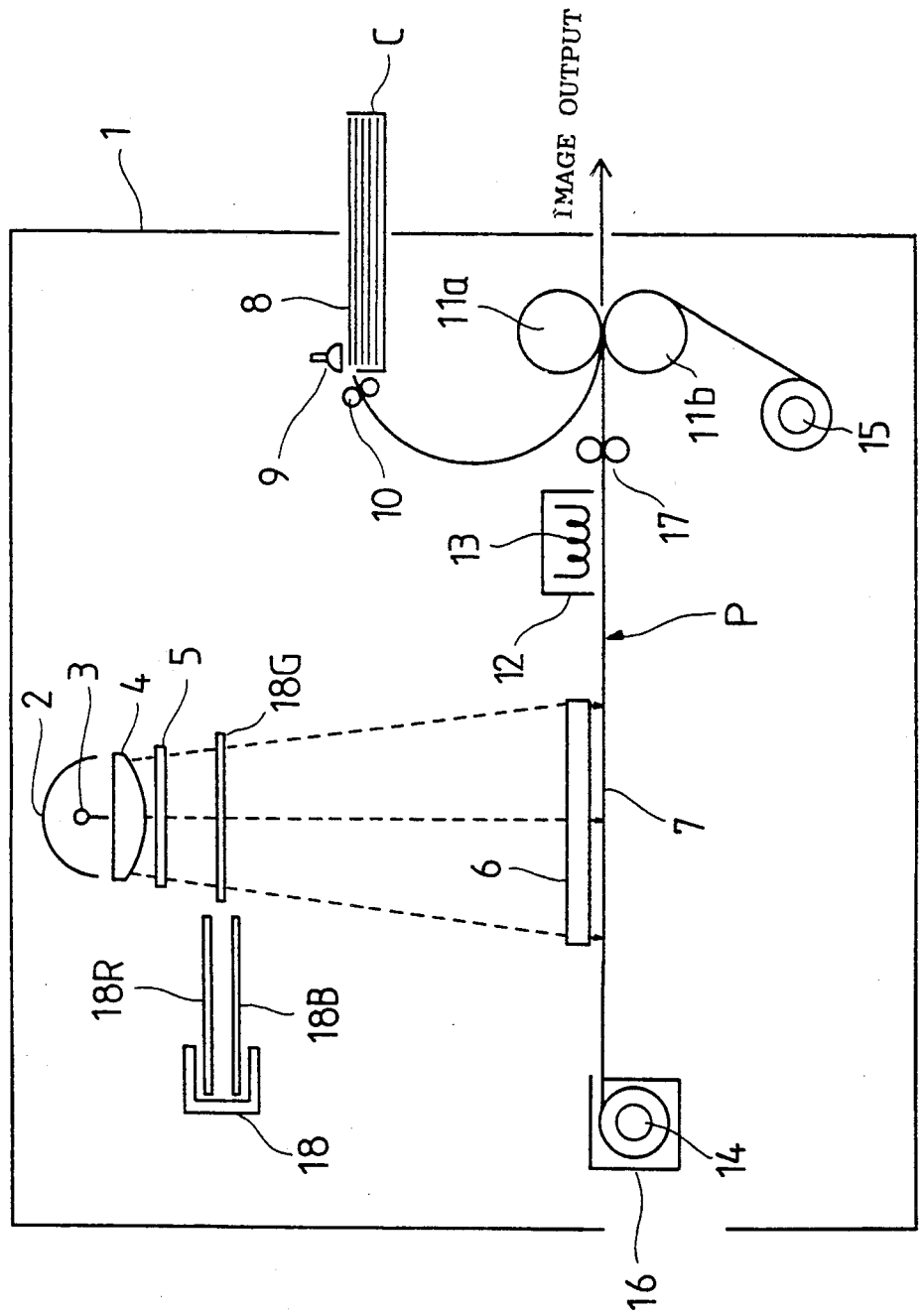
FIG. 1 is a whole schematic view of the apparatus of the present invention, in which a liquid crystal display is used as the exposing device.

The first embodiment of the image recording apparatus utilizing a liquid crystal display (abbreviated as LCD, hereinafter) as a light shutter to expose a microcapsule sheet (described hereinafter) is shown in FIG. 1. In this LCD printer 1, an image to be recorded according to a latent image formed on a microcapsule sheet 7 is recorded on a receiving sheet 8 on which an absorbent applied. As mentioned, the photosensitive recording medium comprising the microcapsule sheet 7 and the receiving sheet 8 is utilized in the LCD printer 1.

Here, the microcapsule sheet 7 utilized in the LCD printer 1 has a base sheet, on one surface of which microcapsules are applied. In each of the microcapsules, a photosensitive silver halide, reductant, polymerizable compounds and coloring agent are encapsulated, and the such constructed microcapsules are rendered hard-enable upon being exposed through light, thereafter hardened by being heated.

And upon one surface of the receiving sheet 8, the absorbent is applied, as described above. Such absorbent is detailedly disclosed in Japanese Patent, Laid-Open No. Sho 61-275742, ect., therefore detailed description of the absorbent will be omitted.

In FIG. 1, a halogen lamp 3 as a exposing light source is located at upper side in the LCD printer 1 and a reflector 2 is arranged at upper position from the halogen lamp 3. At lower position than the halogen lamp 3, a condenser lens 4 is located, further a filter 5 to cut off infrared ray is located at lower position than the condenser lens 4. At left side under the filter 5, a filter unit 18 is positioned. The filter unit 18 accommodates three color filters therein, that is, a red filter 18 R, a green filter 18 G, a blue filter 18 B. Each filter is slidable between the first position where it is accommodated in the filter unit 18 and the second position where it is positioned under the filter 5. Further, the LCD 6 is located at lower position from the color filter positioned at the second position.

At the left side of the LCD 6, a shieldable cartridge 16 having a rotatable shaft 14 therein is located and the non-exposed microcapsule sheet 7 wound around the shaft 14 is accommodated in the cartridge 16. The microcapsule sheet 7 is exposed in a stopped state under the LCD 6 by the LCD 6 and a latent image (an image formed by rendering the microcapsules hardenable) according to an image displayed on the LCD 6 is formed on the microcapsule sheet 7.

A heating device 12 in which a heater 13 is installed therein is located at the right side of the LCD 6. Further, at the right side of the heating device 12 (the side downstream the heating device 12 according to a feeding path P of the microcapsule sheet 7), a pair of feeding rollers 17 to feed the heated microcapsule sheet 7 downstream according to the feeding path P are position. And a pair of pressing rollers 11a, 11b are positioned downstream the feeding rollers 17. The microcapsule sheet 7 is wound around a winding shaft 15 after passing through the LCD 6, the heating device 12, the feeding rollers 17 and the pressing rollers 11a, 11b. And above the pressing rollers 11a, 11b, a cassette C for stacking the receiving sheets 8 is located. Further a sucker 9 is located at the left position over the receiving sheet 8 and a pair of feeding rollers 10 is located at the left end of the cassette C.

Next, motion of the LCD printer 1 mentioned above will be described hereinafter. At first, when a well-known print start key is depressed, an image according to red image signals among image signals input from an external apparatus is displayed on the LCD 6. Followingly, the halogen lamp 3 is turned on. Light emitted from the halogen lamp 3 is condensed effectively in cooperation with the reflector 2 and the condenser lens 4 and is rendered substantially parallel luminous flux. Thereafter, the light is irradiated on the LCD 6 after being passed through the filter 5 and the red filter 18R.

As a result, the microcapsule sheet 7 stopped under the LCD 6 is exposed by the image displayed on the LCD 6 which is controlled by the red image signals of the image to be recorded. After such exposure, the halogen lamp 3 is turned off and the red filter 18R is exchanged with the green filter 18G. And the red image signals to the LCD 6 is changed into a green image signals, further more the microcapsule sheet 7 is exposed by the image displayed on the LCD 6 according to the green image signals after the halogen lamp 3 is turned on. After the exposure, the halogen lamp 3 is turned off again. Followingly, the microcapsule sheet 7 is similarly exposed by the image displayed on the LCD 6 according to a blue image signals. As a result of above three times exposures by the red, the green and the blue image signals, the color latent image is formed on the microcapsule sheet 7.

After exposure, the micro capsule sheet 7 is fed to the heating device 12 through driving force of the feeding rollers 17 and the winding shaft 15. At this time, only the exposed microcapsules except for the non-exposed microcapsules on the microcapsule sheet 7 are hardened by the heating device 12. Thereafter, the microcapsule sheet 7 is fed to the pressing rollers 11a, 11b.

On the other hand, the receiving sheet 8 in the cassette C is fed one by one to the feeding rollers 10 by the sucker 9 and the receiving sheet 8 is fed to the pressing rollers 11a, 11b through the feeding rollers 10. Further, the exposed surface of the microcapsule sheet 7 and the absorbent applied surface of the receiving sheet 8 are superposed each other and both sheets 7, 8 are passed between the pressing rollers 11a, 11b. By pressing both sheets through the pressing rollers 11a, 11b, the non-exposed microcapsules on the microcapsule sheet 7 are ruptured and contents flew out of the ruptured microcapsules transferred onto the absorbent applied surface of the receiving sheet 8. As a result, the color image is recorded on the receiving sheet 8.

Here, the similar color image can be obtained by utilizing a microcapsule sheet having microcapsule in which a leuco dye developed by a developer is encapsulated instead of the coloring agent and a developer sheet on which the developer is applied, instead of the receiving sheet 8.

Figure 2:
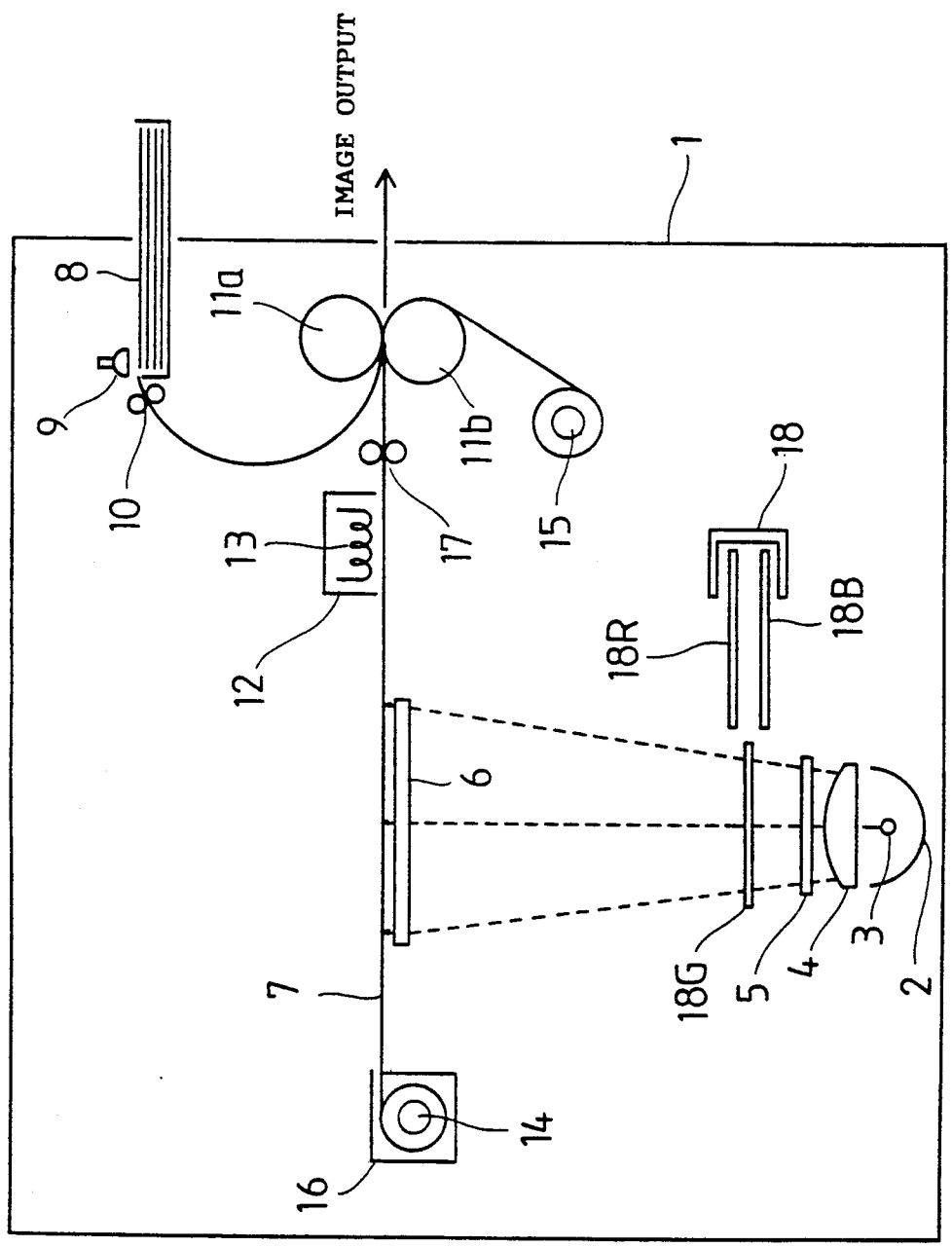
FIG. 2 is a whole schematic view of the apparatus of the present invention, a clear film base sheet with high light-permeability is used as a microcapsule sheet and the liquid crystal display is located at a side of the clear base sheet, on which the microcapsules are not applied.

Following to above, various modifications of the LCD printer 1 will be described. First modification is disclosed in FIG. 2. In FIG. 2, a clear film sheet with high light-permeability such as polyester film is utilized as the base sheet of the microcapsule sheet 7. In case that such clear film sheet is utilized as the base sheet of the microcapsule sheet 7, the LCD 6 can be arranged under the clear film sheet, further under the LCD 6, the filter unit 18, the filter 5, the condenser lens 4, the halogen lamp 3 and the reflector 2 can be arranged. According to this construction, the microcapsule sheet 7 can be exposed from the back surface on which the microcapsules are not applied. And in this case, the LCD 6 can be closely contacted with the back surface of the microcapsule sheet 7 when exposed, since the LCD 6 never injures the microcapsules on the opposite surface of the microcapsule sheet 7. Therefore, the microcapsule sheet 7 can be exposed according to optimum exposing condition that the LCD 6 as the light shutter can closely contact with the microcapsule sheet 7, the microcapsule sheet 7 can be exposed, as a result, the image quality to be recorded can be stable.

Figure 3:
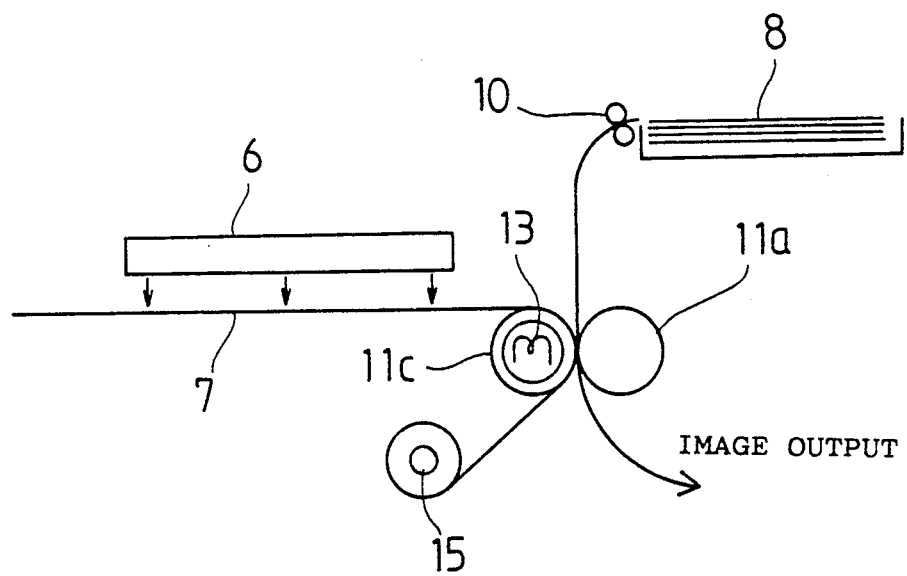
FIG. 3 is a schematic view of the feeding device of the apparatus, which comprises a pair of pressing rollers, one of which has a heater therein.

The second modification in which feeding of the microcapsule sheet 7 is done only by the pressing rollers 11a, 11b with no use of the feeding rollers 17, is conceivable. Thus, in FIG. 3, a pressing roller 11c in which the heater 13 is arranged and the pressing roller 11a are utilized instead of the above pressing rollers and the heating device 12. According to this construction, the microcapsule sheet 7 can be heated and pressed at the same time. Therefore, it can be understood that output time of the image elapsed from pressing of the print start key till output of the image can be shortened because the feeding path P is shortened, as a result, number of parts necessary for the LCD printer 1 can be reduced.

Figure 4:
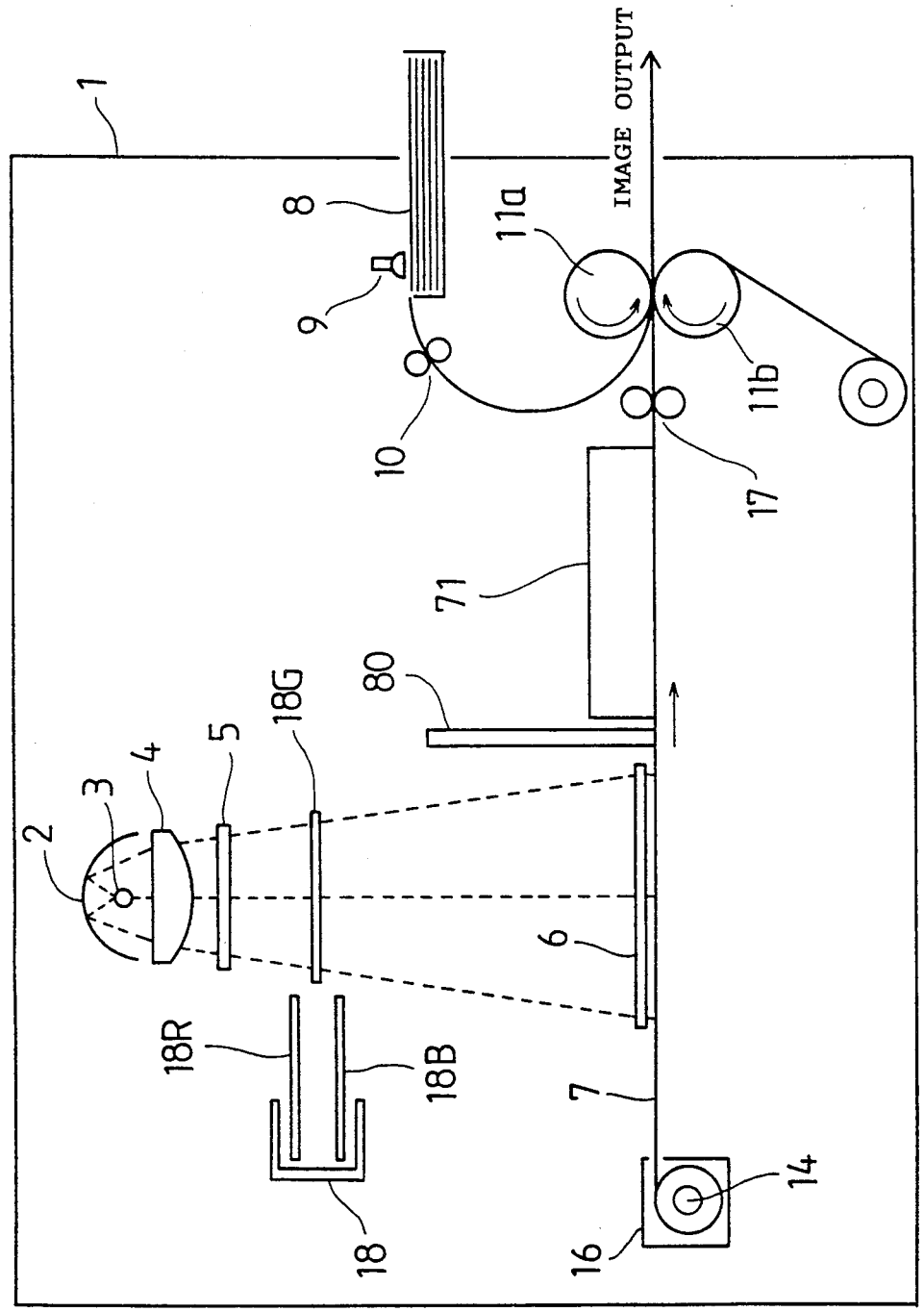
FIG. 4 is a whole schematic view of the apparatus of the present invention, in which a heater array is utilized as the heating device and a screen plate is located between the heater array and the exposing device.
Figure 5:
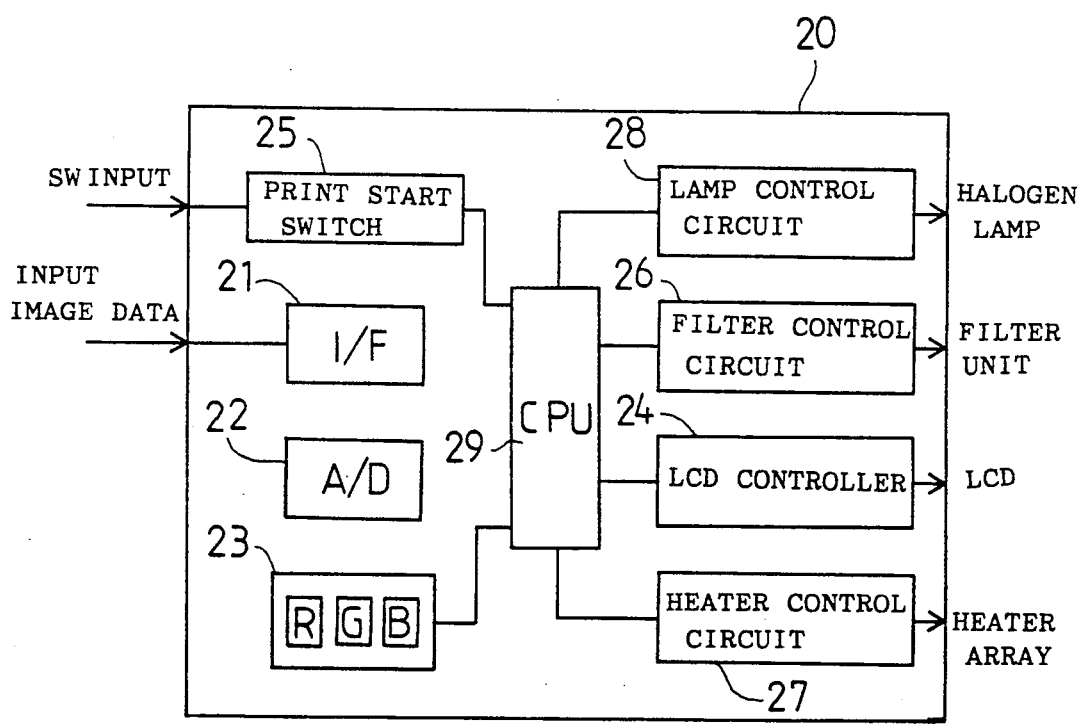
FIG. 5 is a block diagram of a control device of the apparatus according to the present invention.
Figure 7:
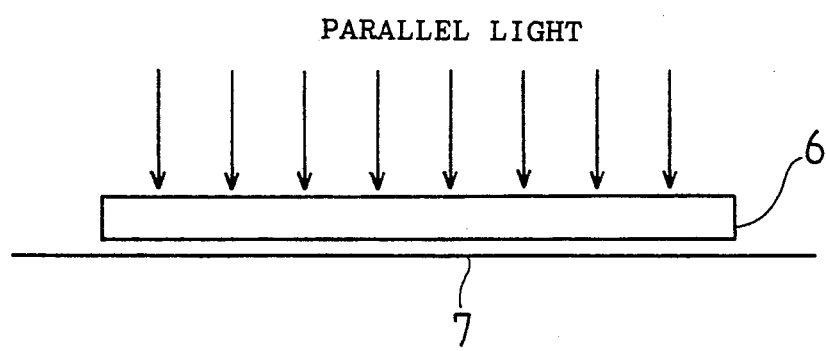
FIG. 7 is a side view of the liquid crystal display when the microcapsule sheet is exposed thereby.
Figure 8:
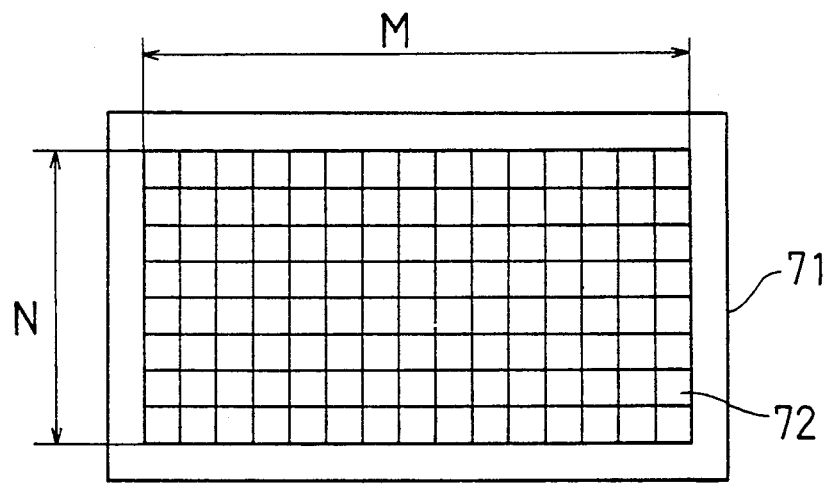
FIG. 8 is a conceptual front view of the heater array utilized in the apparatus of the present invention.
Figure 9:
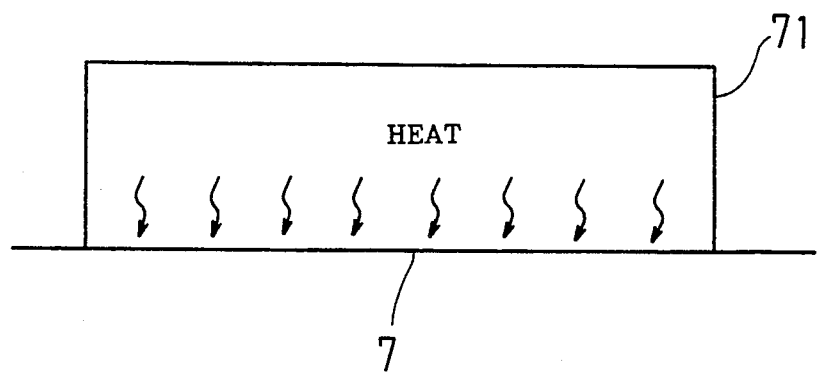
FIG. 9 is a side view of the heater array when the microcapsule sheet is heated thereby.

The third modification of the LCD printer 1 in which a heat screen plate 80 and a heater array 71 are utilized instead of the heating device shown in FIG. 1, is shown in FIG. 4. In this LCD printer 1, a control circuit 20 shown in FIG. 5, the LCD 6 shown in FIG. 6 and 7, a heater array having a plural microheaters 72 shown in FIG. 8 and 9, are utilized.

Referring to these Figs., motion of the LCD printer 1 will be described hereinafter. Upon pressing of a print start switch 25, image data with gradation transferred from an external apparatus is input to the control circuit 20 through the video interface (I/F) 21. And the input data is converted into digital signal corresponding to the red image signal (R data), the green image signal (G data), the blue image signal (B data), respectively, by a A/D converter 22. The obtained R data, G data, B data are stored respectively in memory block of a video RAM 23. Next, a CPU 29 controls all pixels of the LCD 6 to be closed so that the microcapsule sheet 7 is not exposed by unnecessary light from the LCD 6 and transfers control signal to a filter control circuit 26 so that the red filter 18 R is set under the filter 5 by the filter control circuit 26. Further, the CPU 29 transfers control signal to a lamp control circuit 28, so as to turn on the halogen lamp 3.

Next, the R data stored in the video RAM 23 is transferred to a LCD controller 24 through controlling by CPU 29, thus, the image according to the R data is displayed on the LCD 6. As a result, exposure of the microcapsule sheet 7 under the LCD 6 is started as shown in FIG. 7.

Figure 6:
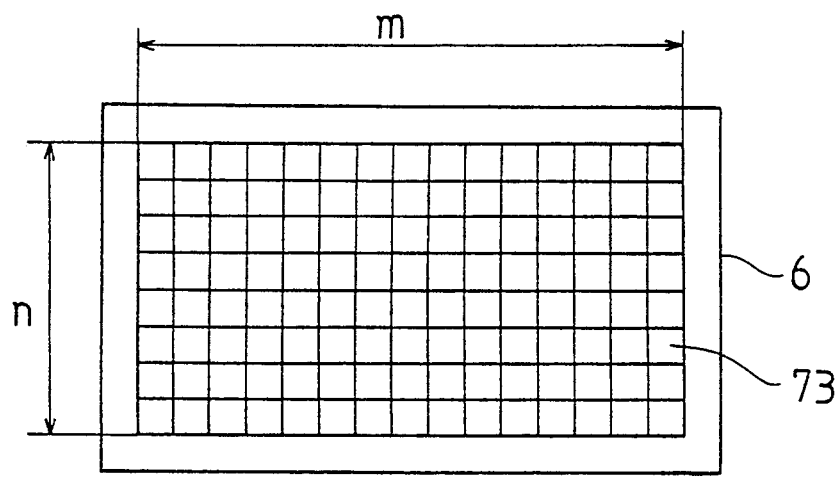
FIG. 6 is a conceptual front view of the liquid crystal display utilized in the apparatus of the present invention.

Here, the LCD 6 has a plurality of pixels 73 (m×n) as shown in FIG. 6, and the red image is exposed on the microcapsule sheet 7 by these liquid crystal pixels 73. While exposing, the gradation of the image is expressed on the microcapsule sheet 7 by changing of opening time of the pixels 73. After exposing of the red image, the image of the green data is displayed on the LCD 6 instead of the image of the red data and exposure of the green image is started. Similarly, after exposing of the green image, the blue image is displayed on the LCD 6 and further exposure of the blue image is started.

After exposure of the images of three colors mentioned above, all pixels 73 of the LCD 6 are closed so that the microcapsule sheet 7 is not exposed by unnecessary light from the LCD 6 and the CPU 29 transfers control signal to the lamp control circuit 28 to turn off the halogen lamp 3.

The microcapsule sheet 7 with the color latent image thereon is fed rightward as shown by an arrow in FIG. 4 to the heater array 71 and heated by the heater array 71. This heater array 71 has a plurality of microheaters 72 (m×n), each of which corresponds respectively to the pixel 73 of the LCD 6 as shown in FIG. 8 and heating temperature of the microheater 72 is controlled by the heater control circuit 27. Therefore, in addition that the gradation of the image can be expressed by changing of opening time of the pixels 73 in the LCD 6, extent of the microcapsules to be hardened may be controlled by heating control of the microheaters 72 as mentioned above, as a result, quality of the gradation in the image can be improved.

Further, the microcapsule sheet 7 is fed to the pressing rollers 11a, 11b and is pressed thereby. At this time, the unexposed microcapsules are ruptured in result that the contents flew out of the ruptured microcapsules flows onto the surface of the receiving sheet 8 on which the absorbent is applied. In result, the color image is recorded on the receiving sheet 8. As mentioned, in case that the heater array 71 with the plural microheaters 72 is utilized as the heater 13 of the heating device 12, the image having the gradation with wide range can be obtained based on that the gradation expression of the image may be controllable by not only the LCD 6 but also the microheaters 72 as mentioned above.

By the way, it is well-known that the image contrast displayed on the LCD 6 is remarkably affected by atmospheric temperature. About this point, heat emitted from the heater array 71 can be prevented from flowing into the LCD 6 by the heat screen plate 80 arranged between the LCD 6 and the heater array 71 as shown in FIG. 4. Therefore, the contrast of the image can be stably maintained, as a result, stable quality of the image can be obtained.

Additionally, it is conceivable that the LCD 6 is arranged separately from the heater array 71 without the heat screen plate 80 to extent that the LCD 6 is not affected by the heat from the heater array 71. Similarly in this case, the contrast of the image can be stably maintained, as a result, stable quality of the image can be obtained because the heat does not flow into the LCD 6.

Further, it is conceivable that the heating device 12 in FIG. 1 is utilized for temperature control of the LCD 6. In this case, same heater can be used both as a heater in LCD 6 for temperature control and the heater 13 of the heating device 12, thus, cost of the LCD printer 1 may go down.

And if it is judged based on data retrieval by the CPU 29 that all data of the R data, the G data and the B data stored in the video RAM 23 are color data without gradation, the CPU 29 transfers a signal to the lamp control circuit 28 to increase quantity of light from the halogen lamp 3 and to speed up recording speed. On the other hand, if it is judged that gradation data exists in the color data, it is necessary to express gradation according to response speed of the LCD 6. In this case, the CPU 29 transfers a signal to the lamp control circuit 28 to decrease quantity of light from the halogen lamp 3 and to express gradation by slowing recording speed. Here, instead of above, the image with high quality gradation can be obtained if the LCD 6 with lower response speed is utilized as the light shutter.

Further, entire brightness of the image to be recorded may be controlled by adjusting heat quantity added to the microcapsule sheet 7 based on condition of control of the heater 13 in the heating device 12 shown in FIG. 1 or the heater array 71 shown in FIG. 4. In this case, brightness of the image to be recorded can be controlled without converting the image data.

And it is not necessary that the microheaters 72 of the heater array 71 respectively correspond to the pixels 73. Here, the plural microheaters 72 are arranged M×N so that each microheater 72 does not correspond to each pixel 73 and controlled respectively to heat the microcapsules by the heater control circuit 27. Therefore, even if the microcapsule sheet 7 is exposed by the LCD 6 with resolution of m×n, the microcapsules on the microcapsule sheet 7 are heated by the heater array 71 with resolution of M×N finer than m×n. As a result, the image is recorded on the receiving sheet 8 with the resolution (m×n) of the LCD 6 and the resolution (M×N) of the heater array 71 when the microcapsule sheet 7 is pressed into rupturing of the microcapsules and the image is recorded on the receiving sheet 8. In this case, the image can be obtained with the rough resolution (m×n) of the LCD 6 and the finer resolution (M×N) of the heater array 71.

Further, a thermal head utilized in a thermal printer, etc. may be used as the heater array 71. In that case, the microcapsule sheet 7 may be controlled to be heated by the thermal head with resolution M of sheet width direction thereof while feeding with resolution of N to feeding direction thereof. By this construction, a cheaper heating device can be obtained.

Figure 10:
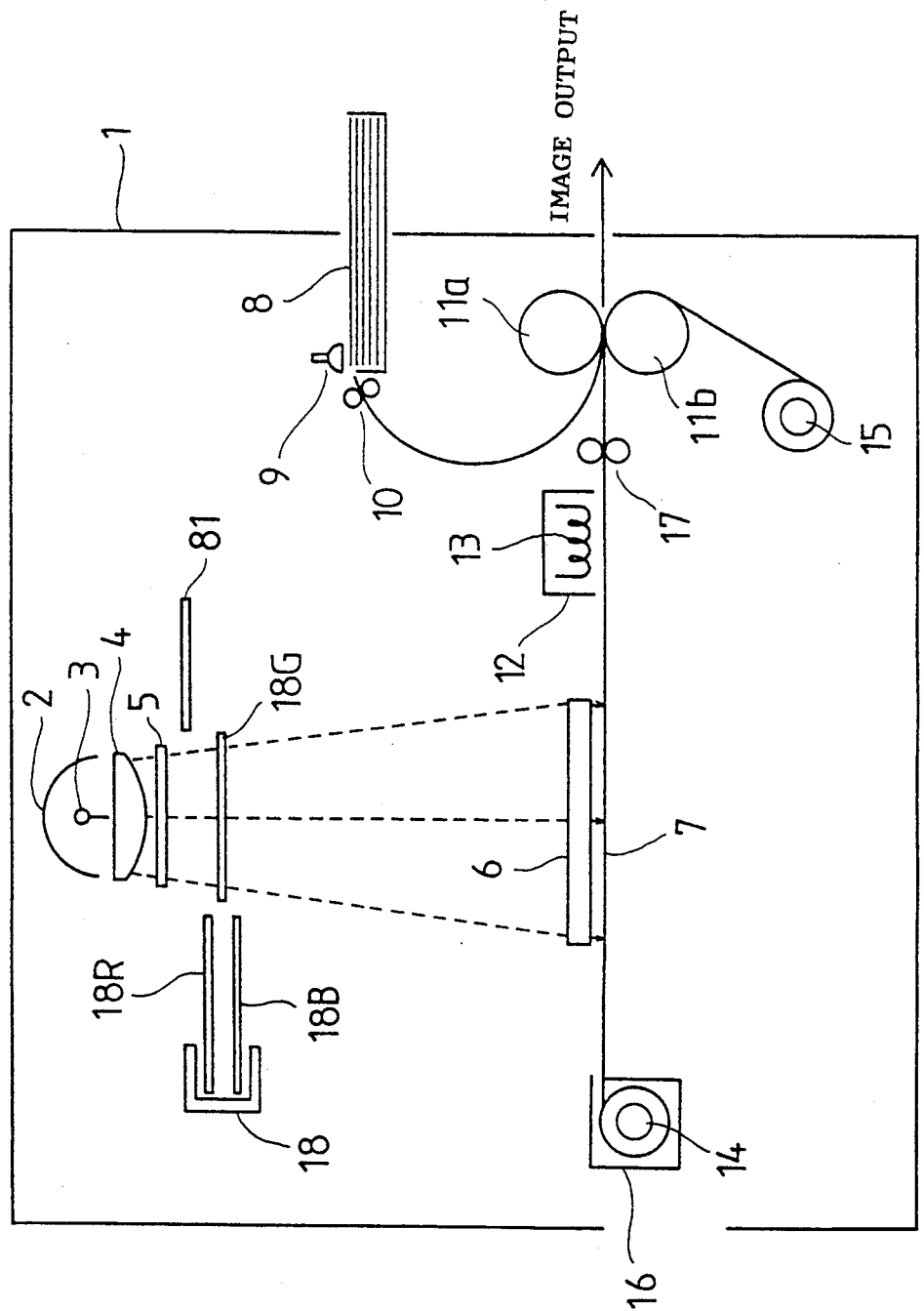
FIG. 10 is a whole schematic view of the apparatus of the present invention, in which the exposing device uses a filter with permeability of infrared ray.

Next, the fourth modification of the LCD printer 1 will be described hereinafter according to FIG. 10. In that printer 1, the filter 5 for cutting off the infrared ray is exchanged with a filter 81 with permeability of the infrared ray after exposure of the microcapsule sheet 7 is completed by the LCD 6 with use of the red filter 18R, the green filter 18G and the blue filter 18B. And the microcapsules on the sheet 7 are selectively hardened by heat passing through the LCD 6 in making use of thermic rays irradiated from the halogen lamp 3. According to this construction, the contrast of the recorded image can be adjusted. And in this case, even a LCD with low contrast can be utilized with use of the thermic rays mentioned above, as a result, parts cost of the LCD printer 1 may be reduced.

Figure 11:
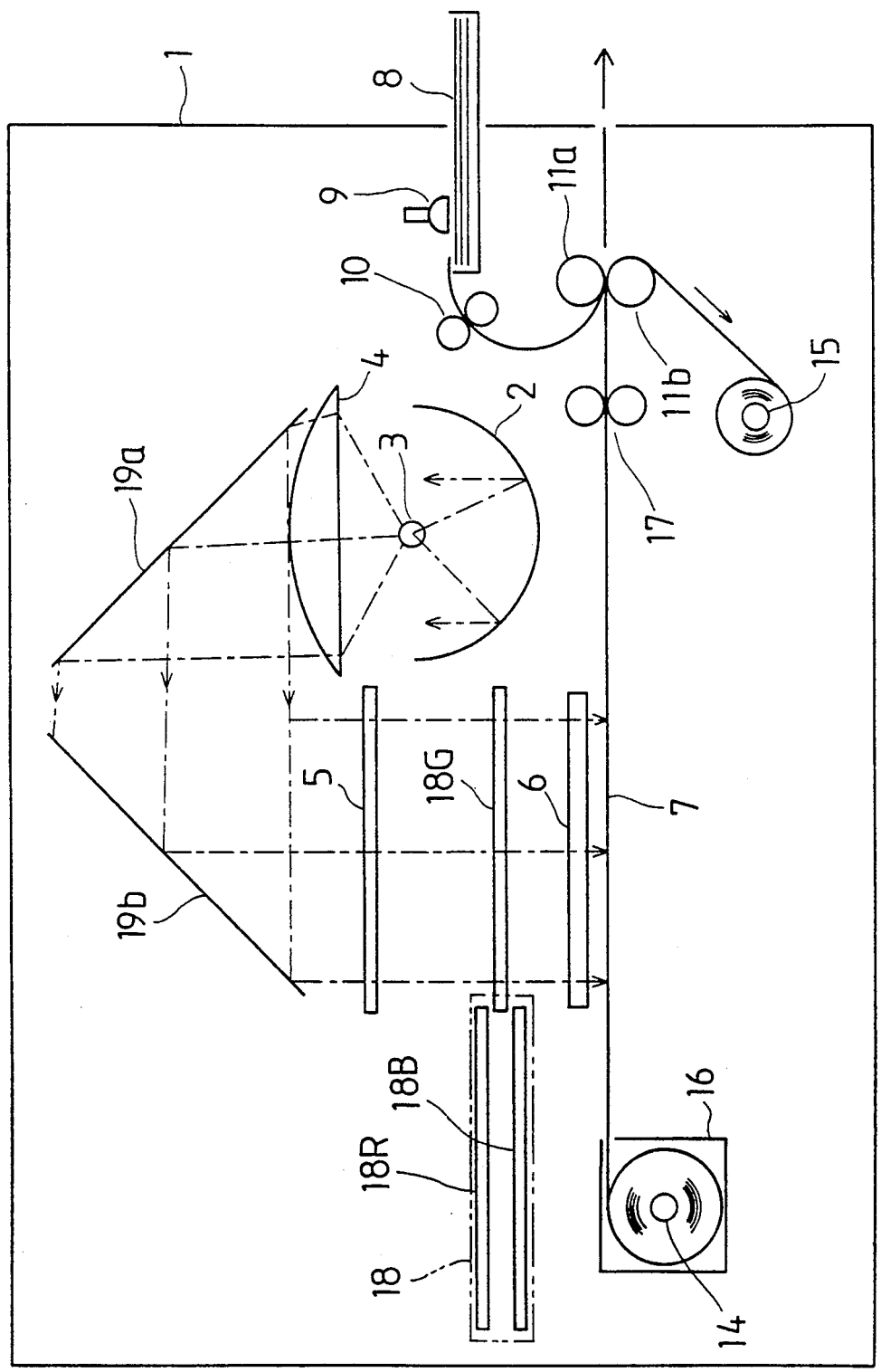
FIG. 11 is a whole schematic view of the apparatus of the present invention, in which a reflector with permeability of infrared ray is utilized and the microcapsule sheet is heated by the infrared ray permeated through the reflector.

The fifth modification will be described according to FIG. 11 hereinafter. In that printer 1, a pair of mirrors 19a, 19b are arranged between the condenser lens 4 and the filter 5, according to the light path, and the reflector 2 is arranged at upper position from the feeding path P of the exposed microcapsule sheet 7. Further, the reflector 2 is made of material with permeability of the infrared rays. According to this construction, the exposed microcapsule sheet 7 can be heated in making use of heat emitted from the halogen lamp 3, so that the microcapsules are hardened after exposed. In this case, the halogen lamp 3 acts as not only the light source but also the heating source, as a result, parts cost of the printer 1 can be reduced.

Figure 12:
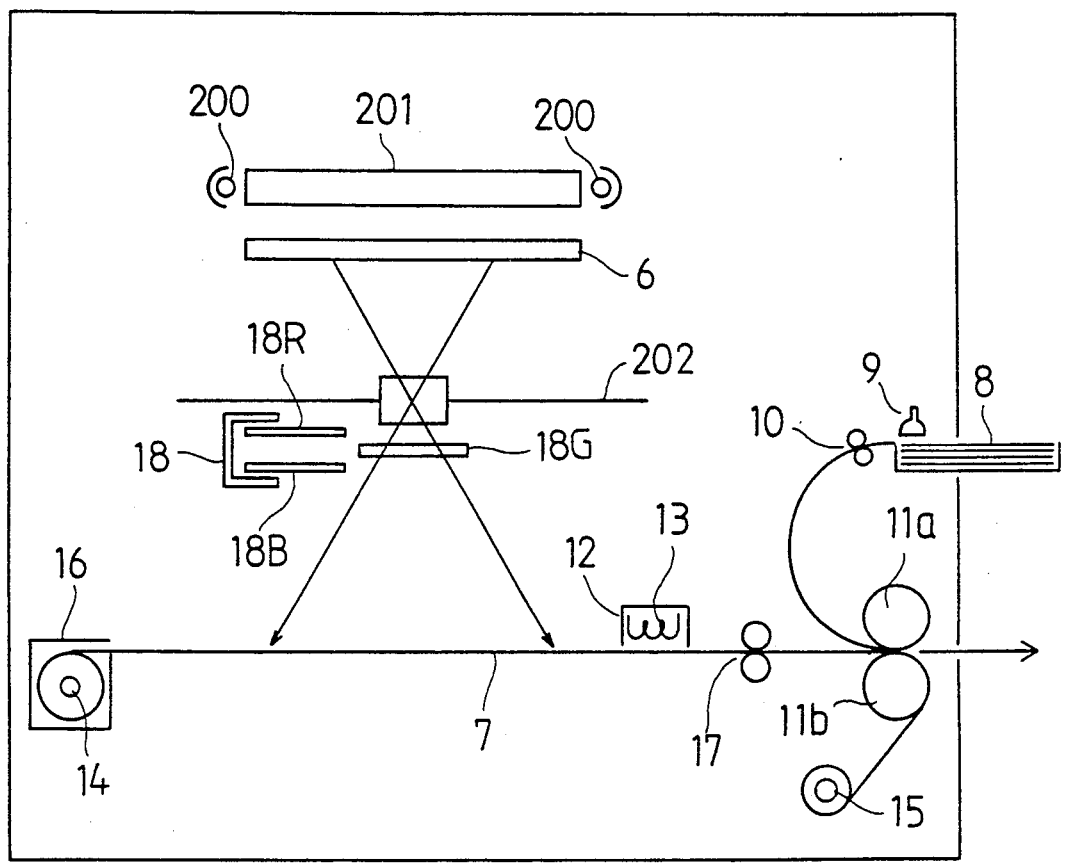
FIG. 12 is a whole schematic view of the apparatus of the present invention, in which a fluorescent ramp as a light source and a focusing optical system to focus an image displayed on the liquid crystal display upon the microcapsule sheet through the fluorescence emitted from the fluorescent tube are utilized.

Next, the sixth modification of the LCD printer 1 will be described according to FIG. 12 hereinafter. In this printer 1, two fluorescent tubes 200 are utilized as the light source. And a scattering plate 201 is arranged between the fluorescent tubes 200. Thus, scattered lights from the plate 201 is irradiated to the LCD 6 positioned at lower side of the plate 201. Further, a screen plate 202 is arranged under the LCD 6, so as to prevent the scattered light from unnecessarily irradiating the microcapsule sheet 7 directly. And a lens 203 is mounted in the plate 202 so that the image displayed on the LCD 6 is focused on the microcapsule sheet 7. In this case, if the lens 203 in above optical system has zooming function, the image to be recorded can be freely magnified or reduced.

Figure 13:
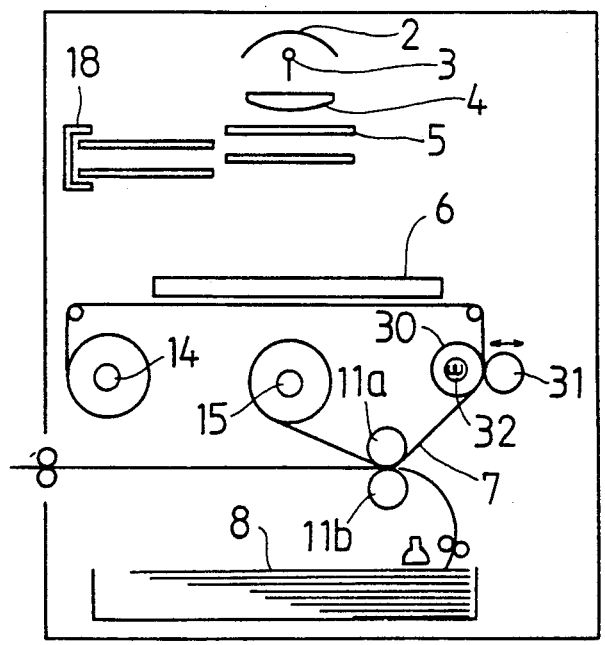
FIG. 13 is a whole schematic view of the apparatus of the present invention, in which the feeding device having a heating roller and a pressing roller are utilized and a halogen lamp as a heater is arranged in the heating roller.

Following above, various modifications of the heating device 12 will be described. At first, the first heating device is shown in FIG. 13. In this device, the heating device comprises a pair of rollers 30, 31 arranged according to the feeding path P of the microcapsule sheet 7. The roller 30 is a heat roller with a halogen lamp 32 as the heating source mounted therein. And the roller 31 is a pressing roller. The heat roller 30 contacts with the surface of the microcapsule sheet 7, on which the microcapsules are not applied. The pressing roller 31 is arranged against to the heat roller 30 in nipping the microcapsule sheet 7 therebetween and pressed to the heat roller 30 with predetermined pressure so as to efficiently transmit the heat from the heat roller 30 to the microcapsule sheet 7. Further, the heat roller 30 and the pressing roller 31 can be separated each other, that is to say, the pressing roller 31 is movable from the first position where the heat roller 30 contacts with the microcapsule sheet 7 to heat thereof to the second position where the heat roller 30 separates from the microcapsule sheet 7. At the first position, therefore, the heat roller 30 can heat the microcapsule sheet 7, on the other hand, at the second position, the heat roller 30 cannot heat the microcapsule sheet 7. And the surface temperature of the heat roller 30 is controlled in the predetermined range of 100°-160° C.

In above construction, the microcapsule sheet 7 is fed to the rollers 30, 31 according to the feeding path P after being exposed by the LCD 6. At this time, the pressing roller 31 is retained at the second position till the top portion of the latent image formed on the microcapsule sheet 7 reaches to the heat roller 30 and the pressing roller 31 is moved to the first position when the top portion of the latent image reaches to the heat roller 30. And the pressing roller 31 is moved again from the first position to the second position after heating of the exposed portion on the microcapsule sheet 7 is completed, then, the heat roller 30 cannot heat the microcapsule sheet 7. In this type of heating device, by means of a releasing mechanism of the pressing roller 31, portion of the heat roller 30 except for the heated portion cannot harden the microcapsules applied on the microcapsule sheet 7.

After heating by the heat roller 30, the heated microcapsule sheet 7 is fed to the pressing rollers 11a, 11b. The microcapsule sheet 7 pressed by the rollers 11a, 11b is rewound to a position where the pressed image positions under the LCD 6 and the microcapsule sheet 7 is provided for next exposure by the LCD 6. Therefore, the microcapsule sheet 7 can be used efficiently without waste. Here, in this construction, the pressing roller 31 is not necessary if the heat roller 30 may give enough heat to the microcapsule sheet 7.

Clearly from above, it can be obtained a beautiful image because the heat roller 30 heats the microcapsule sheet 7 from the back surface on which the microcapsules are not applied, thus, the heat roller 30 does not expose the microcapsule sheet 7 unnecessarily.

Next, the second heating device constructed by modifying the first heating device in FIG. 13, is shown in FIG. 14. In this device, the microcapsule sheet 7 exposed by the LCD 6 is fed to the heating device 33 and the exposed microcapsules on the sheet 7 are hardened in the heating device 33. In the heating device 33, a plurality of heating elements are arranged in a line state with right angles to the feeding path P of the microcapsule sheet 7 and each heating element contacts to the back surface of the microcapsule sheet 7. The micro capsules rendered hardenable by being exposed through the LCD 6 are hardened by heat from the heating elements when the microcapsule sheet 7 passes on the heating elements. These heating elements have a resolution more than 300 dots per inch (dpi) and can selectively heat the microcapsule sheet 7. That is to say, the heating device 33 can selectively give heat to the microcapsules exposed by the LCD 6 on the sheet 7 by controlling the heating elements based on the image signal data transmitted from the external device.

Further, it is judged whether the white image signal data exists in the image signal data input from the external device. If the white image signal data exists, the heating elements are controlled to be highly heated so that the heating elements gives the microcapsule sheet 7 the heat more than normal case when the white portion of the latent image on the microcapsule sheet 7 passes on the heating elements. According to such control of the heating elements, they hardens the microcapsules promotively so that the coloring agent such as coloring material, etc. in the microcapsules unnecessarily does not adhere to the receiving sheet 8 when the image is transferred to the receiving sheet 8. According to this, the white image portion of the image to be recorded can be expressed more white on the receiving sheet 8.

Concerning with the black image portion of the image to be recorded, the heating elements is controlled so as not to be heated. Thus, the microcapsules cannot be hardened even if they are rendered hardenable while exposing by the LCD 6. Therefore, the coloring agent in the microcapsules is almost transferred on the receiving sheet 8 when the image is transferred to the receiving sheet 8. Accordingly, the black image portion of the image to be recorded can be expressed more black on the receiving sheet 8. For example, while recording the black image portion, the heating device 33 does not harden the microcapsules if the heating elements are not heated, though the microcapsules not to be essentially rendered hardenable are apt to become hardenable because narrow area portion of the black character, etc. is easily exposed by the light surrounding therearound. And with the use of this heating device 33, non-heated portion can be formed in voluntary area exposed on the microcapsule sheet 7, therefore, the black characters or figures can be formed in the exposed area of the microcapsule sheet 7 in latent image forming process.

Here, a conductive film sheet 70 may be utilized as the base film of the microcapsule sheet 7 as shown in FIG. 15. The conductive film sheet 70 includes a conductive resisting material such as carbon, etc.. In this case, the heating device 33 has a plurality of electrodes arranged in a line state, instead of the heating elements described above. According to this construction, the base film of the microcapsule sheet 7 can be selectively heated by turning on the electrodes based on the image signals input from the external device and the microcapsules applied onto the base film can be selectively hardened.

Therefore, according to the above heating device 33, the microcapsules on a voluntary position of the microcapsule sheet 7 can be hardened in the latent image forming process before the image is transferred on the receiving sheet 8 in superposing both the microcapsule sheet 7 and the receiving sheet 8. Thus, the microcapsules corresponding to the white image portion of the image to be recorded is completely hardened according to the image signals input from the external device. Therefore, the coloring agent such as coloring material unnecessary for forming the image is never transferred on the receiving sheet 8. Further, the black characters or figures can be formed in not only the black image portion but also the non-black image portion corresponding to the image data input externally since the microcapsules rendered hardenable by exposing can be voluntarily hardened. Additionally, as the heating device 33 can heat only the latent image portion, the microcapsule sheet 7 is never damaged by the heat from the heating device 33 in case that the portion except for the latent image portion in the microcapsule sheet 7 passes through the heating device 33. As a result, the portion without the latent image can be utilized again for forming the latent image, therefore, the cost of the microcapsule sheet 7 necessary to record one image may be reduced.

Figure 16:
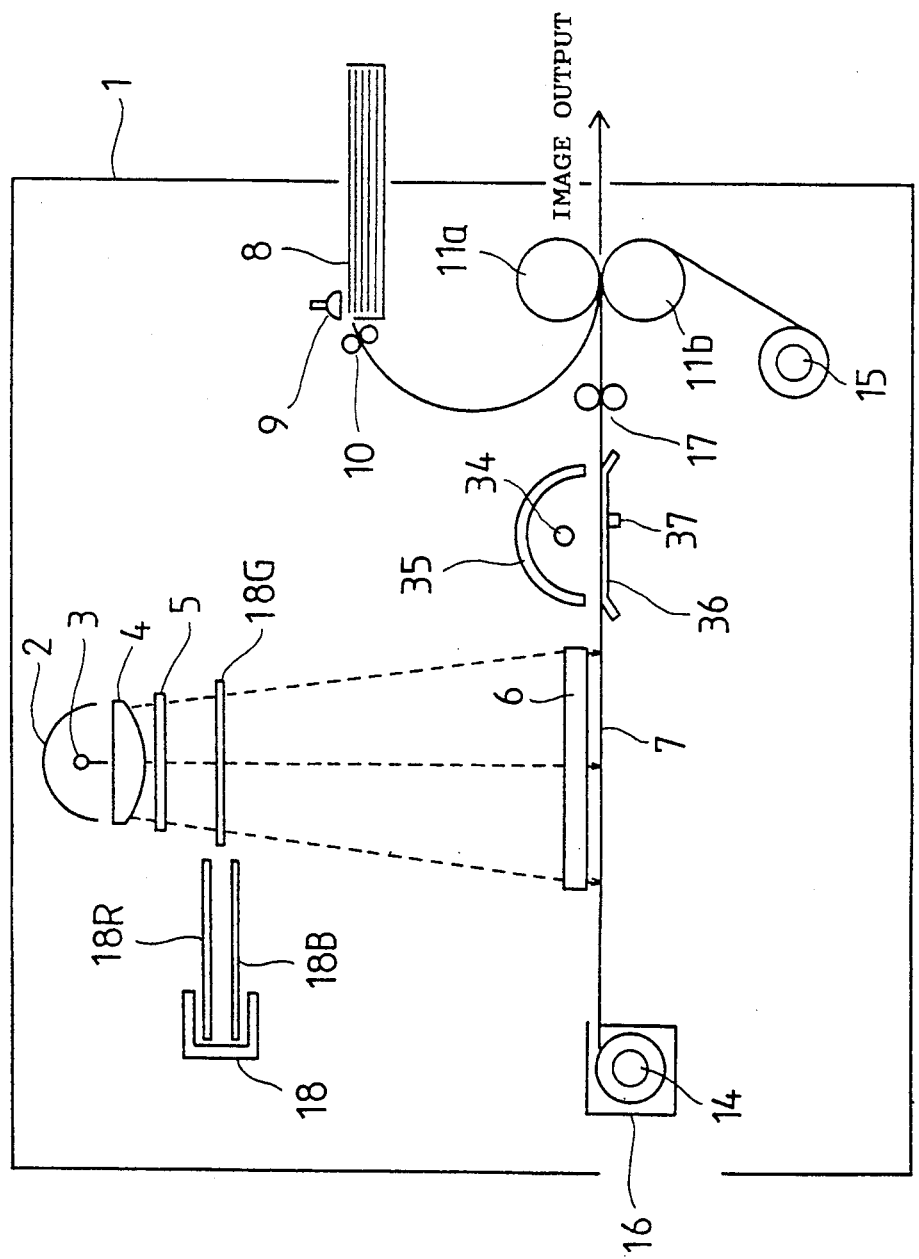
FIG. 16 is a whole schematic view of the apparatus of the present invention in which a ceramic heater is utilized as the heating device.

The third heating device which is a modification of the heating device 12 in FIG. 1, is shown in FIG. 16. This heating device comprises a ceramic heater 34, a reflector 35, a heat plate 37 and a sensor 37. The ceramic heater 34 is controlled so that the surface of the heat plate 36, on which the microcapsule sheet 7 is fed, retains predetermined temperature in cooperation with the sensor 37 fixed on the back surface of the heat plate 36. This temperature is preset in the range of 100° C.-150° C. and the temperature to be preset is selected based on various conditions of the feeding speed, the atmospheric temperature, the image output mode. And a ceramic material to emit far-infrared rays is utilized as the ceramic heater 34 because it is desirable that the wavelength of the thermic rays from the ceramic heater 34 does not coincide with the sensitive wavelength of the microcapsule sheet 7.

In such construction, the exposed microcapsule sheet 7 is fed to the heat plate 37 from the exposing unit (LCD 6). At this time, the far-infrared rays emitted from the ceramic heater 34 reaches to the microcapsule sheet 7. And the reflector 35 efficiently directs the far-infrared rays from the ceramic heater 34 to the microcapsule sheet 7. The microcapsule sheet 7 is exposed by the far-infrared rays and the latent image is formed by hardening the microcapsules.

Here, a blower may be arranged in the heating device to forcibly blow heated air to the microcapsule sheet 7. In this case, the microcapsules are efficiently heated by the blown air since the heated air is forcefully circulated in the heating device through the blower when the exposed microcapsule sheet 7 is fed to the heat plate 36 from exposing plate. As a result, the latent image is formed on the microcapsule sheet 7 by hardening the hardenable microcapsules through exposing.

Thus, according to such constructed heating device, a beautiful image can be obtained without injuring the surface of the microcapsule sheet 7 since the far-infrared rays heats the microcapsule sheet 7 to irradiate the upper surface on which the microcapsules are applied. Further, the microcapsules are not sensitized by the heating device because the wave length of the far-infrared rays does not coincide with the sensitive wavelength of the microcapsules.

Figure 17:
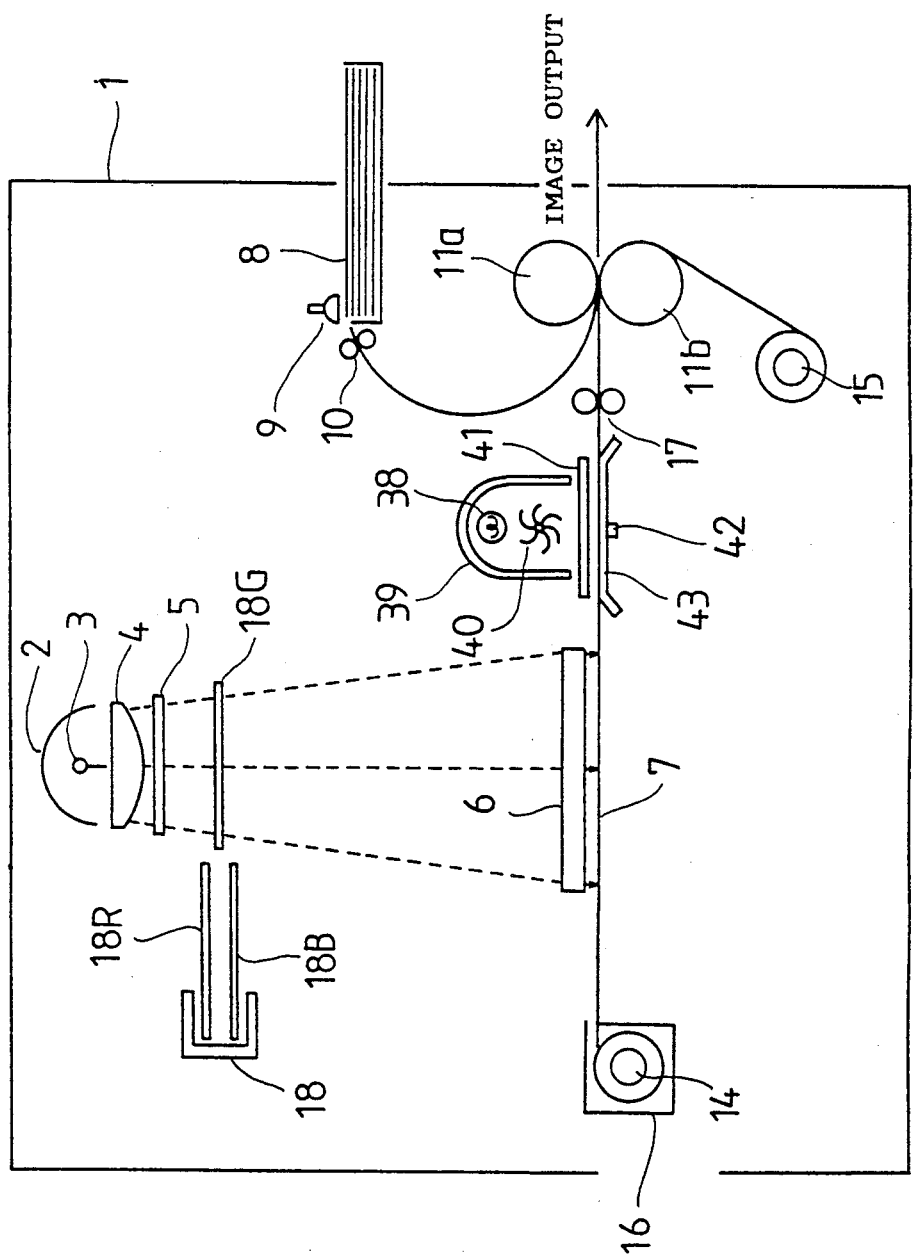
FIG. 17 is a whole schematic view of the apparatus of the present invention in which a halogen heater is utilized as the heating device.

The fourth heating device is shown in FIG. 17. This heating device comprises a halogen heater 38, a reflector 39, a glass plate 41 with permeability of the infrared rays, a heat plate 42 and a sensor 43. The halogen heater 38 is controlled so that the surface of the heat plate 42, on which the microcapsule sheet 7 is fed, retains predetermined temperature in cooperation with the sensor 43 fixed on the back surface of the heat plate 42. This temperature is preset in the range of 100° C.-150° C. and the temperature to be preset is selected based on various conditions of the feeding speed, the atmospheric temperature, the image output mode. The exposed microcapsule sheet 7 is fed to the heat plate 42 from exposing plate. At this time, the emitted light from the halogen heater 38 in only the range from far-infrared light to infrared light among the light in the range from far-infrared light to visible light is permeated through the glass plate 41 and reaches to the microcapsule sheet 7. The reflector 39 efficiently directs the infrared rays passing through the glass plate 41 to the microcapsule sheet 7. As a result, The microcapsule sheet 7 is exposed by the infrared rays and the latent image is formed by hardening the microcapsules.

Here, the blower 40 may be arranged in the heating device to forcibly blow heated air to the microcapsule sheet 7. In this case, the microcapsules are efficiently heated by the blown air since the heated air is forcefully circulated in the heating device through the blower 40 when the exposed microcapsule sheet 7 is fed to the heat plate 42 from exposing plate. As a result, the latent image is formed on the microcapsule sheet 7 by hardening the hardenable microcapsules through exposing.

As mentioned above, a beautiful image can be obtained without injuring the surface of the microcapsule sheet 7 as the thermic rays heats the microcapsule sheet 7 to irradiate the upper surface on which the microcapsules are applied.

Figure 18:
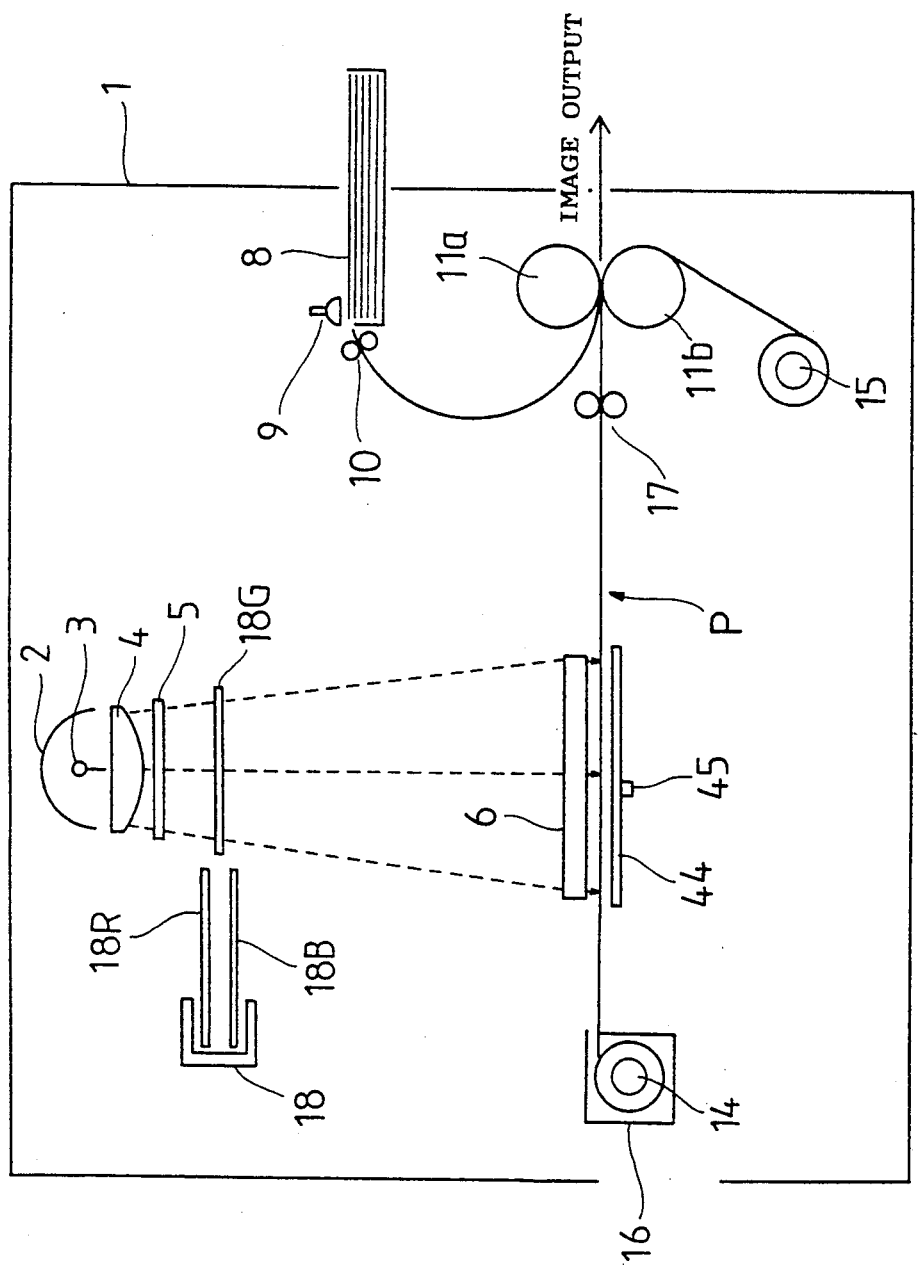
FIG. 18 is a whole schematic view of the apparatus of the present invention in which a plane heater is utilized as the heating device.

The fifth heating device is shown in FIG. 18. This heating device comprises a plate heating element 44 and a sensor 45. The plate heating element 44 acts as exposing plate and contacts with the microcapsule sheet 7 fed thereto. In the plate heating element 44, a heater comprising a nichrome wire as heat source mounted in a molded form made of materials such as magnesium oxide which has high heat conductivity and is used for insulator, is utilized. Or a heater comprising a ceramic composite such as silicon carbide, silicon nitride, is utilized as the plate heating element 44. The microcapsule sheet 7 is strained with predetermined strain force and contacted to the plate heating element 44 so that heat from the plate heating element 44 is efficiently transmitted to the microcapsule sheet 7. And The surface temperature of the plate heating element 44 is controlled so that the temperature become predetermined temperature in the range of 100°-160° C. This microcapsule sheet 7 is exposed on the plate heating element 44 by the LCD 6. At the time, the microcapsule sheet 7 is heated and exposed simultaneously, or heated after exposed. The heated microcapsule sheet 7 is fed to the pressing rollers 11a, 11b.

According to the such constructed heating device, since the microcapsule sheet 7 is exposed and heated simultaneously, image recording time can be considerably shortened by neglecting exposing time, in comparing with the case that heating of the microcapsule sheet 7 is done after exposing thereof. And the image recording time can be also shortened by shortening the feeding path P of the microcapsule sheet 7 because the heating device locates under the LCD 6, therefore, distance between the LCD 6 and the pressing rollers 11a, 11b become shorter. Here, the microcapsule sheet 7 is stopped on the upper surface of the plate heating element 44 while heating, and in this case, distribution of the temperature on the plate heating element 44 is controlled uniformly over the upper surface.

On the other hand, if the temperature distribution of the plate heating element 44 is gradually controlled higher and higher according to the feeding direction of the feeding path P of the microcapsule sheet 7 in order to shorten the recording time more and more, the microcapsule sheet 7 can be fed with higher speed. In this case, the temperature of the plate heating element 44 is controlled so that all amount of heating energy received by the microcapsule sheet 7 in latent image forming area become a predetermined value.

Figure 19:
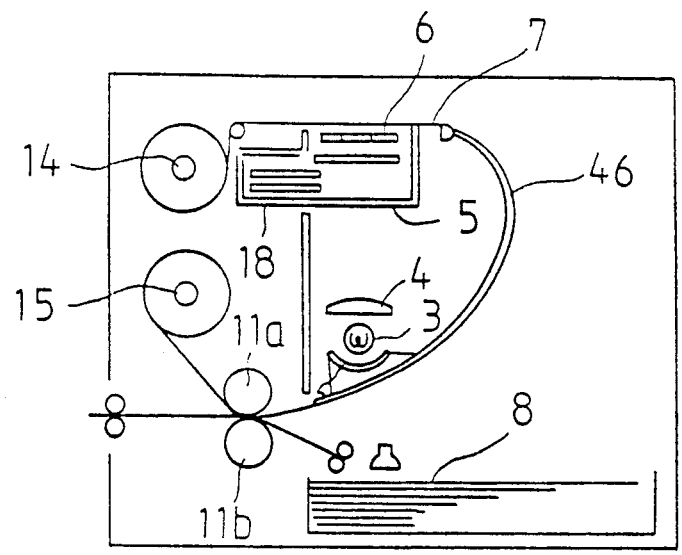
FIG. 19 is a whole schematic view of the apparatus of the present invention in which a halogen lamp is utilized as both the exposing device and the heating device.

The sixth heating device is shown in FIG. 19. In this device, the halogen lamp 3 is utilized for the purpose of both exposing and heating of the microcapsule sheet 7. Under the halogen lamp 3, the reflector 2 is arranged and the condenser lens 4 is located at upper position of the halogen lamp 3. Further, the filter 5 for cutting off the infrared rays is arranged at upper position of the condenser lens 4 and the filter unit 18 is located between the filter 5 and the LCD 6. The LCD 6 is covered with heat-insulating material located right side of the LCD 6 and the filter 5, thus, the thermic rays emitted from the halogen lamp 3 does not reach to the LCD 6 by both the heat-insulating material and the filter 5. Further, a curved heat conductive plate 46 is arranged at right position of the exposing device so that the heat conductive plate 46 contacts with the microcapsule sheet 7. The heat conductive plate 46 is made of material with high heat conductivity such as aluminum, copper, etc.. And the heat conductive plate 46 is heated by heat radiated from the halogen lamp 3, convection of atmospheric air and conducted heat from the reflector 2.

According to such construction, when the microcapsule sheet 7 is exposed, the halogen lamp 3 is turned on and thereafter the microcapsule sheet 7 is fed to the exposing device. While exposure of the microcapsule sheet 7 is started, the heat conductive plate 46 is heated simultaneously, therefore, the microcapsule sheet 7 is heated mainly by the heat conductive plate 46 so that the microcapsules on the sheet 7 are hardened according to the latent image. Thereafter, the microcapsule sheet 7 is fed to the pressing rollers 11a, 11b. After development by the rollers 11a, 11b, the microcapsule sheet 7 is rewound till non-developed portion reaches to the LCD 6 and next exposure of the microcapsule sheet 7 is done on the non-developed portion. Therefore, the microcapsule sheet 7 can be efficiently used without waste. And the halogen lamp 3 can act as the light source of the exposing device to expose the microcapsule sheet 7 and the heat source of the heating device to harden the microcapsules, accordingly, cost of the LCD printer 1 and consumption of electric power can be reduced.

Here, in the first heating device through the sixth heating device, it is a matter of course that control parameters of heating temperature, heating time and heating speed are set to the optimum value based on conditions of kind of the microcapsule sheet 7 with different heat capacity, circumstances of the temperature and humidity in or out of the printer 1, difference of hardening condition when the microcapsules are hardened caused by dispersion in manufacturing of the microcapsule sheet 7, difference of the input signals for setting recording condition of the image to select density of the recording image.

BY the way, efficient use of the microcapsule sheet 7 is significant in the LCD printer 1 mentioned above since it depends on how to be able to obtain many images or how to reduce the cost for performing the printer 1.

Figure 20:
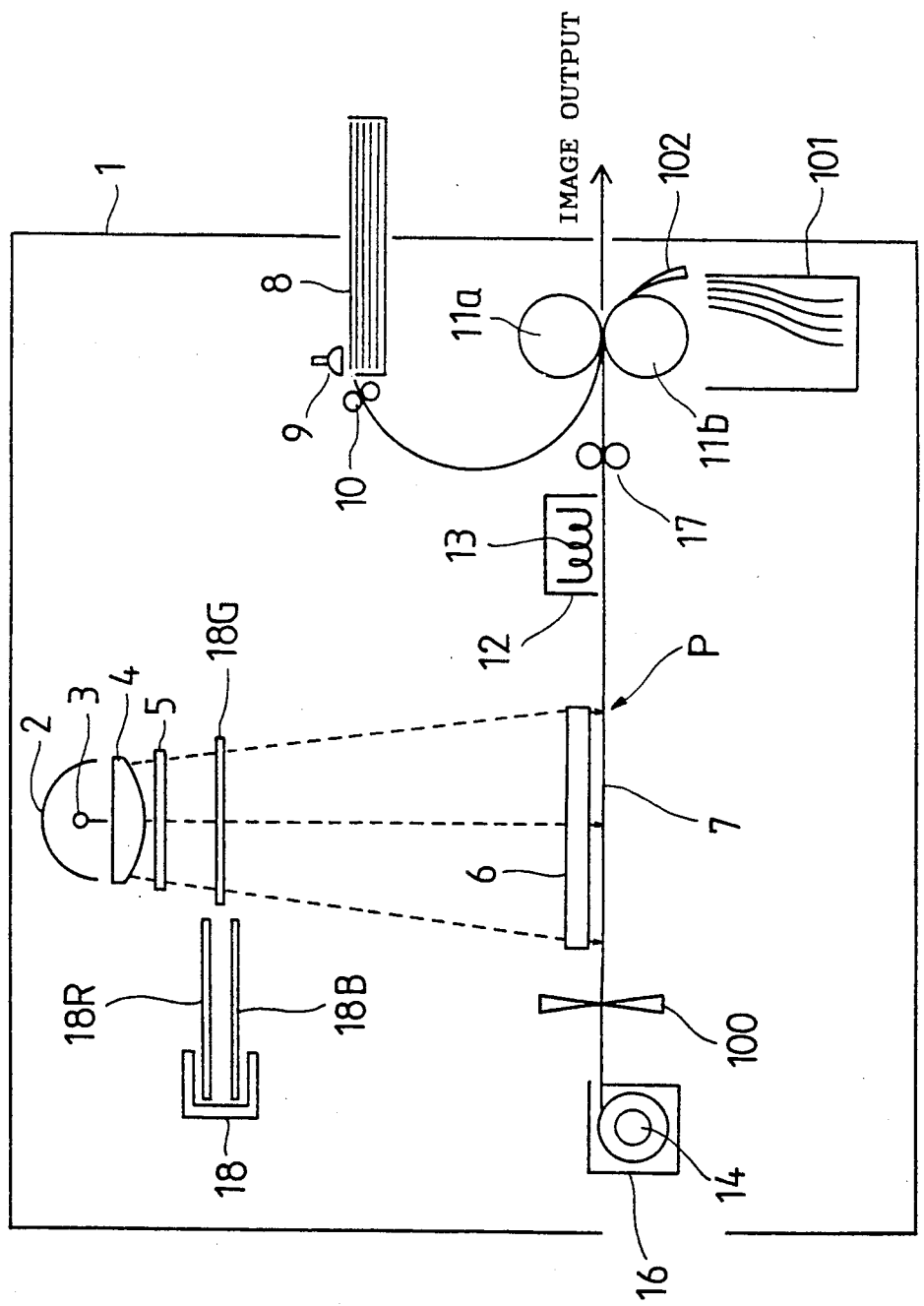
FIG. 20 is a whole schematic view of the apparatus of the present invention in which a cutter is arranged on the feeding path of the microcapsule sheet between a cartridge of the microcapsule sheet and the liquid crystal display.

Modifications to efficiently use the microcapsule sheet 7 will be described hereinafter. The first instance is shown in FIG. 20. In the instance, a cutter 100 is arranged on the feeding path P between the cartridge 16 and LCD 6. And a separator 102 to separate the cut microcapsule sheet 7 from the pressing roller 11b is located downstream the pressing rollers 11a, 11b and further a container 101 to accommodate the used microcapsule sheet 7 is located under the separator 102. In this construction, the microcapsule sheet 7 is cut by the cutter 100 after exposed by the LCD 6. Thereafter, the microcapsule sheet 7 is fed to the heating device 12 by the feeding device (not shown) and after heating by the heating device 12, the microcapsule sheet 7 is pressed by the pressing rollers 11a, 11b in superposing with the receiving sheet 8. Thereafter, the microcapsule sheet 7 is separated from the pressing roller 11b by the separator 102 and accommodated into the container 101 to scrap. Here, the width of the microcapsule sheet 7 is wider than that of the receiving sheet 8. thus, the separator 102 separates the microcapsule sheet 7 from the receiving sheet 8 with use of that difference in the sheet width between them.

Figure 21:
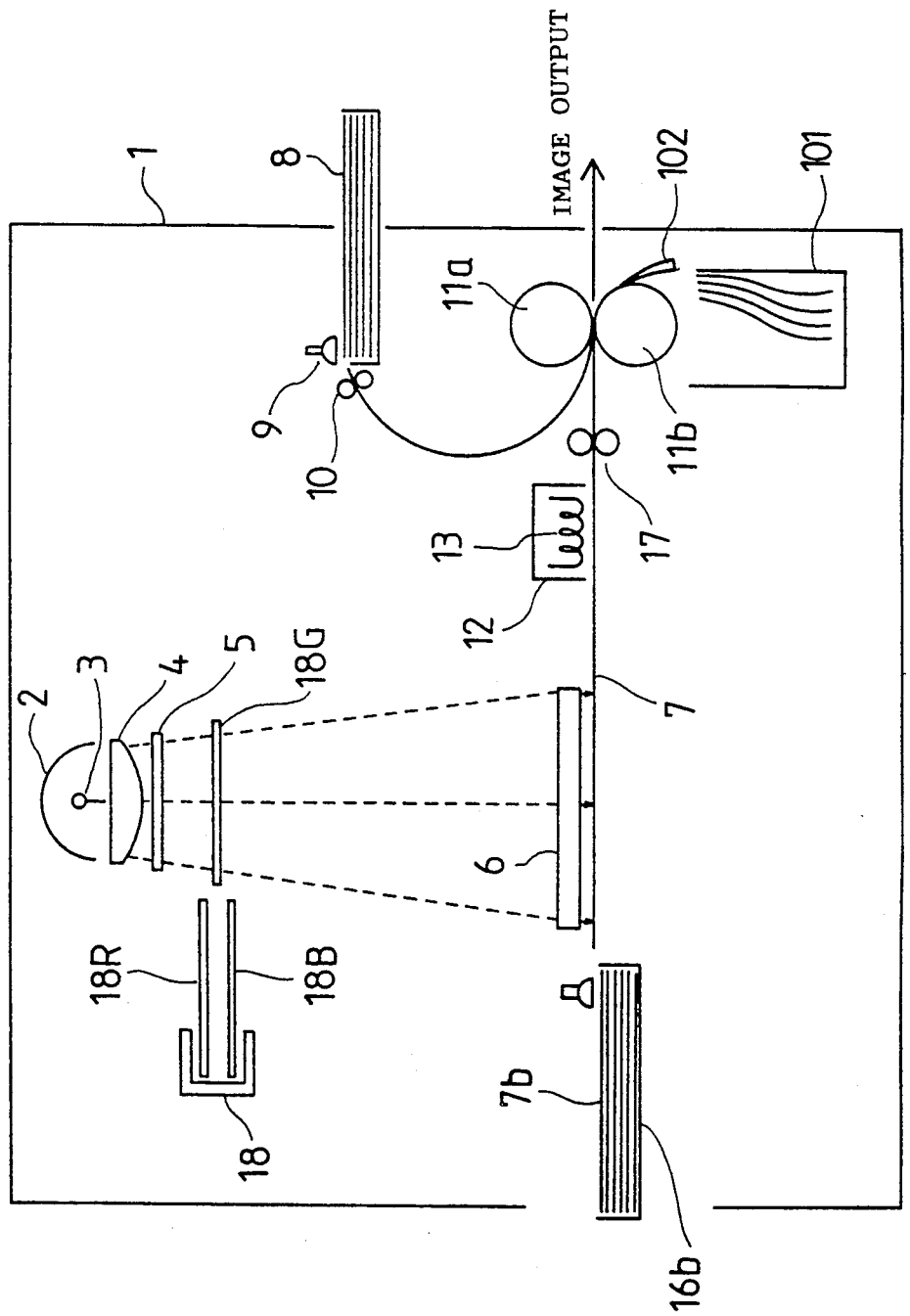
FIG. 21 is a whole schematic view of the apparatus of the present invention in which the microcapsule sheet cut into a predetermined size is utilized.

According to such construction, since the distance between the LCD 6 and the cutter 100 can be very shortened, the wasteful use of the microcapsule sheet 7 can be efficiently prevented. Of course, a cut type of the microcapsule sheet 7b accommodated in a cassette 16b can be utilized as shown in FIG. 21, instead that the cut microcapsule sheet formed by cutting the continuous type of the microcapsule sheet 7 is used.

It is conceivable as the second instance that the microcapsule sheet 7 is rewound to utilize the non-used portion after the image is transferred to the receiving sheet 8 by the pressing rollers 11a, 11b. In this case, wasteful use of the microcapsule sheet 7 can be prevented by arranging the mentioned rewinding mechanism of the microcapsule sheet 7 if there is no problems in heating the non-exposed portion by the heating device 12.

Om the other hand, in case that there is some problems in heating the non-exposed portion of the microcapsule sheet 7, such non-exposed portion of the microcapsule sheet 7 which exists between the entrance of the heating device 12 and the pressing rollers 11a, 11b is wasted in spite of arranging the rewinding mechanism because the non-exposed portion is already heated when the image is transferred to the receiving sheet 8.

Figure 22A:
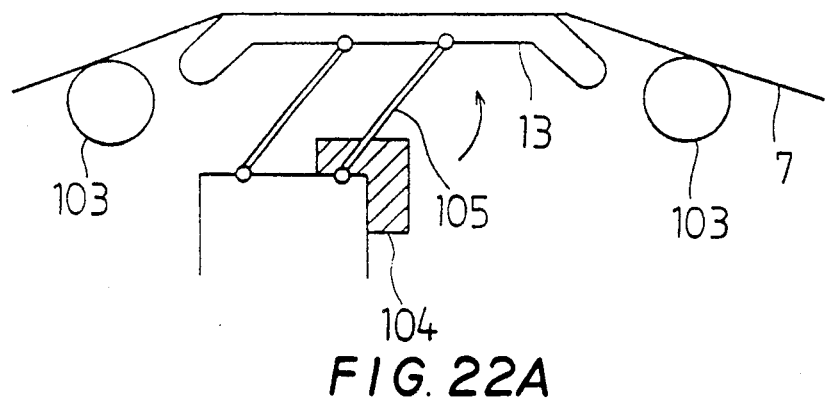
FIG. 22(a) and FIG. 22(b) are partially schematic views of the apparatus of the present invention respectively, in which a plate heater movable between a contact position where the plate heater is contacted with the microcapsule sheet to heat thereof and a non-contact position where the plate heater is not contacted with the microcapsule sheet not to heat thereof, FIG. 23(a), (b) and (c) are partially schematic views of the apparatus of the present invention respectively, in which a pair of guide rollers, a pair of heaters located lower position than the guide rollers and a dancer roller located movably up and down between the heaters are arranged.
Figure 22B:
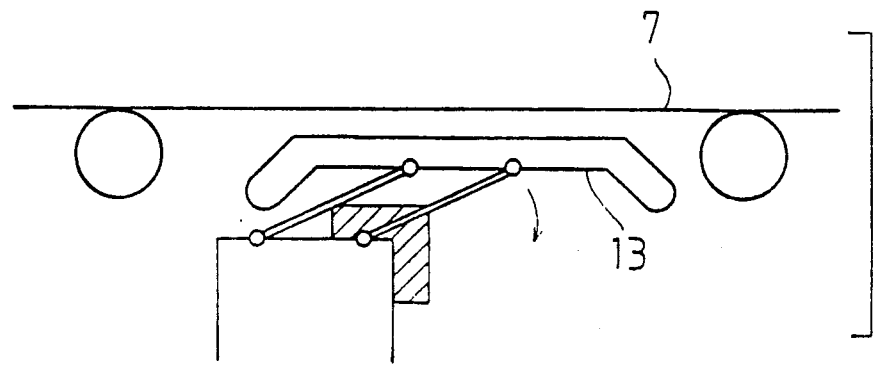

To achieve the problems mentioned above, it is conceivable that heating and non-heating of the microcapsule sheet 7 on the feeding path P is voluntarily switched. In order to accomplish such concept, the heating device 12 is modified as shown in FIG. 22. In this construction as the third instance, the plate heater 13 is constructed to be movable up and down in retaining level state thereof between a pair of guide rollers 103 by a crank mechanism 105 driven through a motor 104. The microcapsule sheet 7 is strained over the guide rollers 103. When the microcapsule sheet 7 is heated, the plate heater 13 is moved to upper position than the guide rollers 103 as shown in FIG. 22(a), therefore, the plate heater 13 contacts to the back surface of the microcapsule sheet 7 and heats it. Contrarily, when non-heating of the microcapsule sheet 7, the plate heater 13 is moved to lower position than the guide rollers 103 as shown in FIG. 22(b), therefore, the plate heater 13 separates from the back surface of the microcapsule sheet 7. Accordingly, heating of the sheet 7 is stopped. Here, of course, it is conceivable that the guide rollers 103 moves up and down instead of the plate heater 13 because the plate heater 13 and the guide rollers 103 move relatively.

Therefore, according to above construction, if the microcapsule sheet 7 is heated selectively in accordance with necessity by the plate heater 13, the waste non-exposed portion which cannot be used because of heating thereof become only the length of the plate heater 13, while using the non-exposed portion rewound.

Figure 23A:
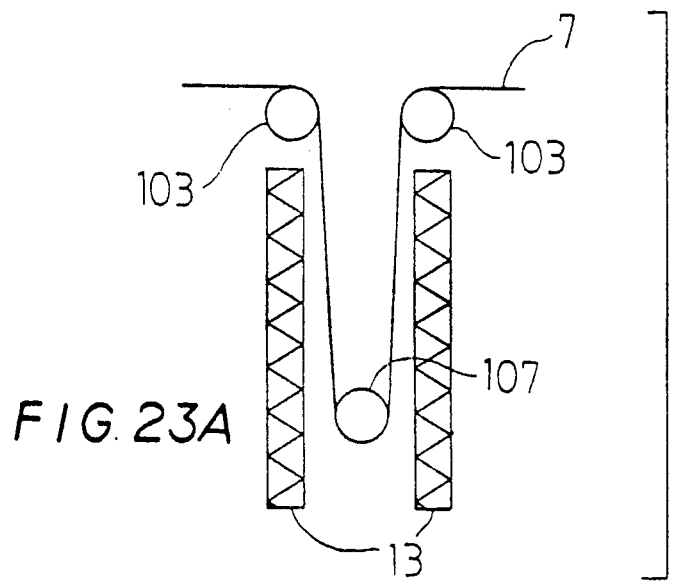
Figure 23B:
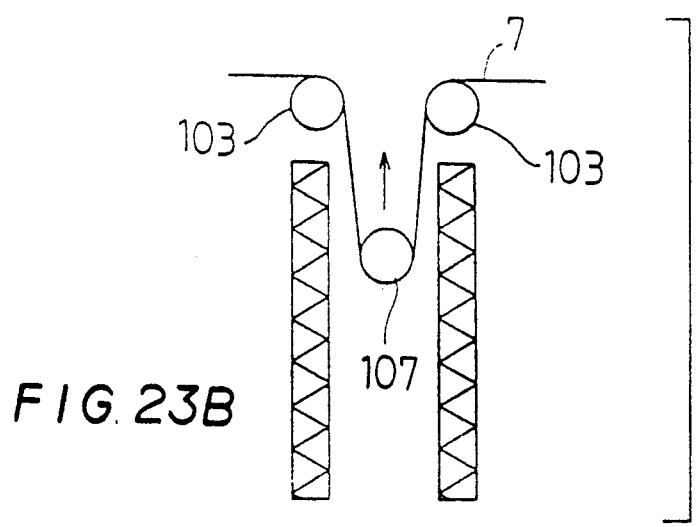
Figure 23C:
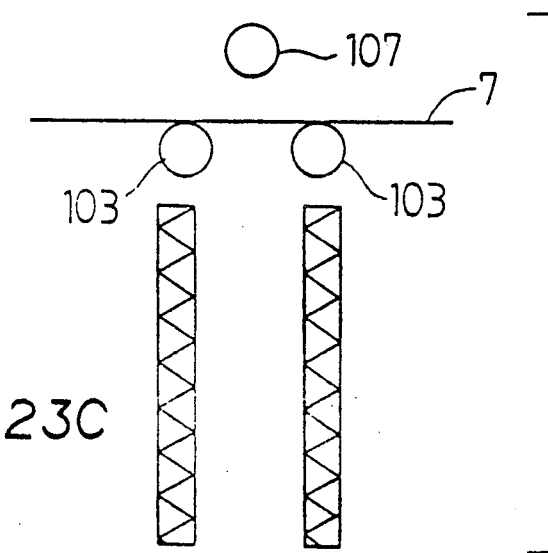

However, reducing the wasted amount of the microcapsule sheet 7 by shortening the plate heater length is restricted because the plate heater 13 must give the microcapsule sheet 7 the heat amount necessary for heating process. To accomplish above problems, the heating device 12 is modified as shown in FIG. 23. In this construction as the fourth instance, a dancer roller 107 movable up and down is arranged between the guide rollers 103 and a pair of heaters 13 arranged under each guide roller 103. When heating of the microcapsule sheet 7, the microcapsule sheet 7 is lowered downwardly by the dancer roller 107 and heated by the heaters 13, as shown in FIG. 22(a). After heating of the microcapsule sheet 7, the dancer roller 107 gradually moves upward as shown in FIG. 22(b), thus, the necessary portion of the microcapsule sheet 7 can be heated. Further, when non-heating of the microcapsule sheet 7, the dancer roller 107 moves to the upper position than the guide rollers 103 as shown in FIG. 22(c), thus, the microcapsule sheet 7 is completely separated from the guide rollers 103.

Therefore, according to above construction, since the necessary portion of the microcapsule sheet 7 can be heated in accordance with necessity, the waste non-exposed portion which cannot be used because of heating thereof become substantially the distance between the guide rollers 103, while using the non-exposed portion rewound. Here, whole construction of the LCD printer 1 with the rewinding mechanism of the microcapsule sheet 7 is no limited to the LCD printer shown in FIG. 1.

Figure 24:
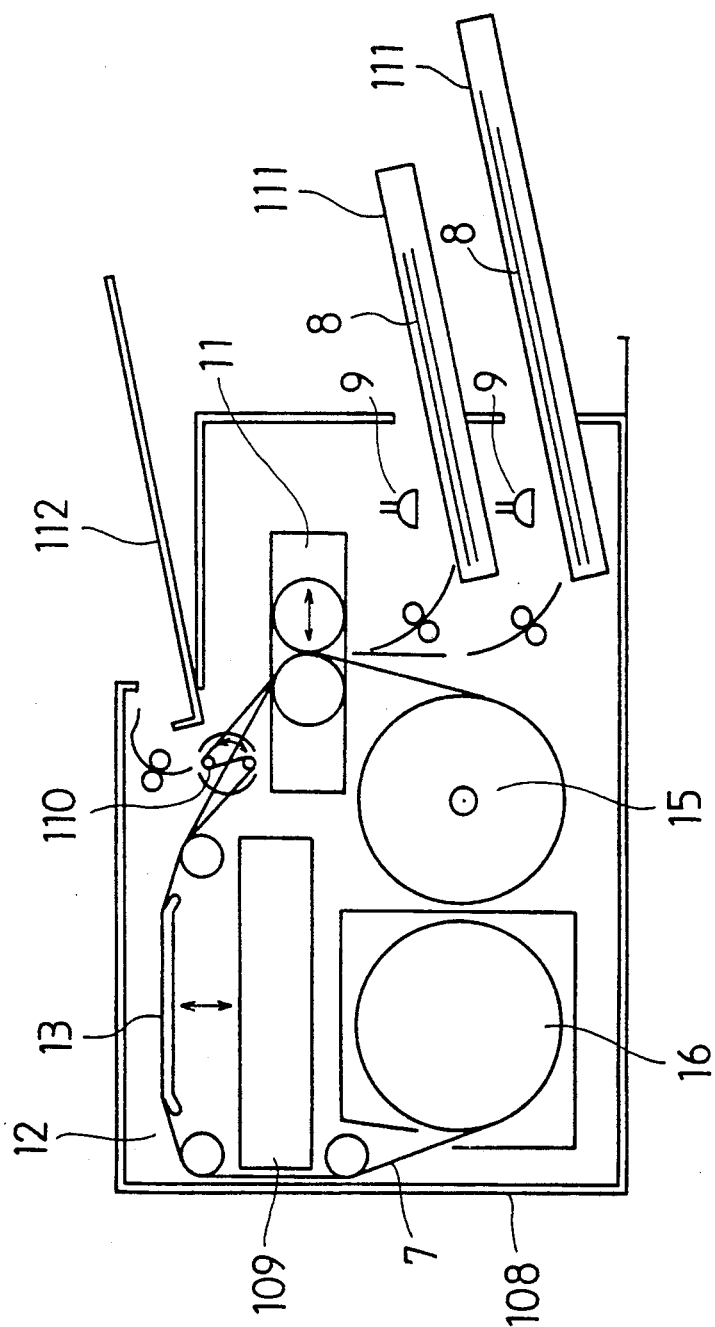
FIG. 24 is a whole schematic view of the apparatus of the present invention in which a rewinding mechanism of the microcapsule sheet is arranged.

Further, the other instance is shown in FIG. 24. The instance concerns with line-exposing LCD printer 108 and at the left lower position within the printer 108, the cartridge 16 in which the non-exposed microcapsule sheet 7 is accommodated is located. The microcapsule sheet 7 drawn from the cartridge 16 is wound around the winding shaft 15 through the LCD exposing unit 109, the heating device 12 and the pressing rollers 11. Here, the LCD exposing unit 109 conducts line-exposing of the microcapsule sheet 7 by exposing from the back surface of the sheet 7 while feeding thereof. The plate heater 13 shown in FIG. 22 is utilized as the heating device 12 and this plate heater 13 contacts and heats the back surface of the microcapsule sheet 7. The pressing rollers 11 are rendered movable each other between nipping state of the sheet 7 and separate state. A pair of separating rollers 110 are arranged between the heating device and the pressing rollers 11. Such seperating rollers 110 are rotatable around a middle point between the rollers 110 and usually positioned mutually so as not to contact the microcapsule sheet 7 existing between the heating device 12 and the pressing rollers 11. And at right side of the winding shaft 15, sheet cassettes 111 accommodating the receiving sheets 8 are arranged. Feeding units including the suckers 9 are located at upper position of each sheet cassette 111. At both upper position of the rollers 11 and right position of the separating rollers 110, a sheet discharging tray 112 is arranged.

According to above constructed LCD printer 108, motion thereof will be described hereinafter. In the exposing process and the heat developing process, the microcapsule sheet 7 drawn from the cartridge 16 is exposed by the exposing unit 109, heated by the heating device 12 and thereafter wound around the winding shaft 15. At this time, the pressing rollers are separated each other and the separating rollers 110 are positioned so as not to contact the microcapsule sheet 7. After the exposed portion of the microcapsule sheet 7 is passed through the heating device 12, the heating device 12 stops heating of the sheet 7. Thereafter, feeding of the microcapsule sheet 7 is stopped when the end of the exposed portion reaches to the pressing rollers 11.

Then, rewinding process and pressing process of the microcapsule sheet 7 is started. At first, the receiving sheet 8 is fed from the sheet cassette 111 by the sucker 9 and further fed to the pressing rollers 11. At this time, the pressing rollers are contacted with each other to nip both the microcapsule sheet 7 and the receiving sheet 8 in superposing thereof. And rewinding of the microcapsule sheet 7 is conducted while the image on the sheet 7 is transferred to the receiving sheet 8 pressed by the pressing rollers 11. Further, when the receiving sheet 8 is fed to front position of the separating rollers 110, the separating rollers 110 are rotated, thus, the microcapsule sheet 7 and the receiving sheet 8 are separated each other by the separating rollers 110. Thereafter, rewinding of the microcapsule sheet 7 is continued and stopped after the receiving sheet 8 on which the image is transferred is discharged to the sheet discharging tray 112.

According to the LCD printer 108 with the rewinding mechanism of the microcapsule sheet 7 mentioned above, characteristic advantage hereinbelow can be obtained in addition to above advantage to be able to efficiently use the microcapsule sheet 7. That is to say, it is not necessary to consider influence caused in the exposing process by feeding irregularity of the microcapsule sheet 7 in the pressing process, since the exposing process and the heating process are conducted independent of the transferring process and the pressing process. This advantage is very significant for the line-exposing apparatus because it is usually necessary for the line-exposing printer in order to achieve above problem that a buffer means such as dancer roller has to be arranged between the exposing part and the pressing part.

Needless to say, the line-exposing part in the above printer is not limited to the LCD 6. And the above construction can be utilized in a line-exposing analog copy machine. Further, the heating device 12 is not limited to the plate heater 13 and the other heater such as the dancer roller 107 shown in FIG. 23 can be utilized.

Next, the second embodiment in which a laser light source instead of the LCD is utilized will be described hereinafter. In this embodiment, the microcapsule sheet 7 which comprises a base sheet such as a paper or polyethyleneterephthalate and three kinds of microcapsules which are uniformly mixed and applied on the base sheet. The microcapsules comprises a sensitive microcapsule in which cyan coloring material is encapsulated, a sensitive microcapsule in which magenta coloring material is encapsulated and a sensitive microcapsule in which yellow coloring material is encapsulated. Thus, the microcapsule sheet 7 has the microcapsules having three spectral sensitivity and each microcapsule is rendered hardenable irradiated by light with characteristic wavelength, respectively. Here, the cyan microcapsule sensitizes to the light wavelength of 650 nm with peak sensitivity, the magenta microcapsule sensitizes to the light wavelength of 550 nm with peak sensitivity and the yellow microcapsule sensitizes to the light wavelength of 450 nm.

Figure 25:
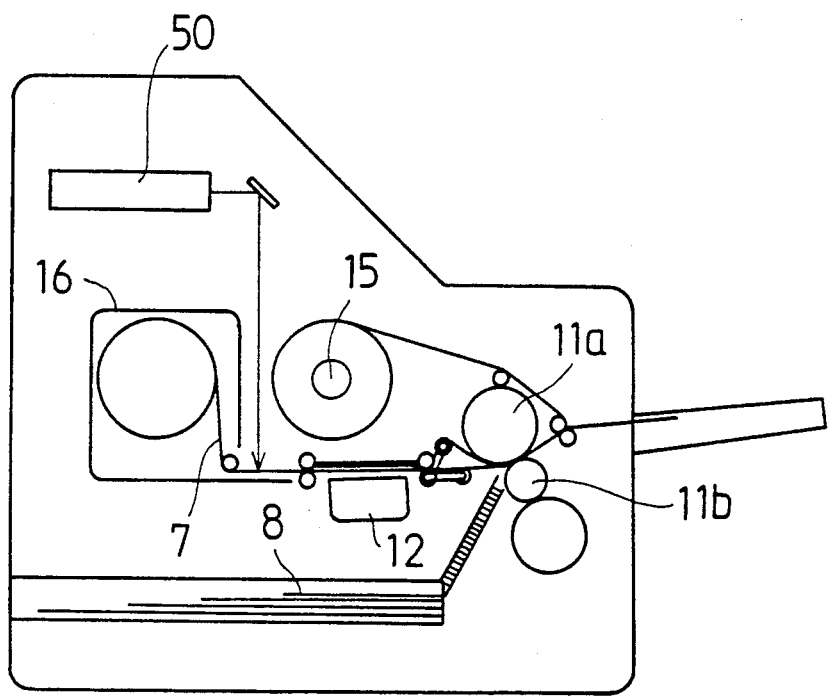
FIG. 25 is a whole schematic view of the apparatus of the present invention in which a laser scanning exposing device is utilized as the exposing device and the microcapsule sheet is exposed by laser beam scanned from the laser scanning exposing device.
Figure 26:
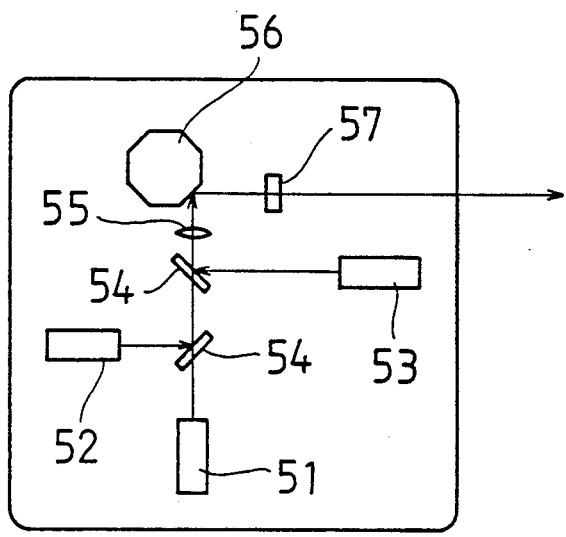
FIG. 26 is a partially schematic view of the laser scanning exposing device in which half-mirrors are utilized.

In the second embodiment, a laser scanner 50 for exposing the microcapsule sheet 7 is utilized as the exposing device. A printer with laser scanner 50 is shown in FIG. 25. And the laser scanner 50 is shown in FIG. 26. In FIG. 26, three laser oscillators are utilized in the laser scanner 50. The first laser oscillator 51 emits the light with 650 nm wavelength to sensitize the cyan microcapsules. The second laser oscillator 52 emits the light with 550 nm wavelength to sensitize the magentga microcapsules. The third laser oscillator 53 emits the light with 450 nm wavelength to sensitize the yellow microcapsules.

The light emitted from the oscillators 51, 52, 53 collected into one light path through two half-mirrors 54 and the collected light is irradiated on a light scanning mirror 56 through a condenser lens 55. And the light irradiated on the light scanning mirror 56 is directly scanned on the microcapsule sheet 7 through a f-θ lens 57.

In case that color printing is conducted by the above constructed printer, the cyan laser oscillator 51, the magenta laser oscillator 52 and the yellow laser oscillator 53 are controlled to turn on or turn off based on the printing information or the image outputting information transferred from the well-known CPU. For example, if only the cyan laser oscillator 51 is turned on and the magenta laser oscillator 52, the yellow laser oscillator 53 are turned off, only the cyan microcapsules are sensitized and rendered hardenable. As a result, the magenta microcapsules and the yellow microcapsules are not rendered hardenable even if the microcapsule sheet 7 is heated by the heating device 12, therefore, the magenta microcapsules and the yellow microcapsules are ruptured by the pressing rollers 11a, 11b. Accordingly, the contents (coloring agent) flown out of the ruptured microcapsules and the asorbent on the receiving sheet 8 react each other, thus, the red image is formed by mixing two colors.

Similarly, if only the magenta laser oscillator 52 is turned on and the cyan laser oscillator 51, the yellow laser oscillator 53 are turned off, only the magenta microcapsules are sensitized and rendered hardenable. As a result, the cyan microcapsules and the yellow microcapsules are not rendered hardenable even if the microcapsule sheet 7 is heated by the heating device 12, therefore, the cyan microcapsules and the yellow microcapsules are ruptured by the pressing rollers 11a, 11b. Accordingly, the contents (coloring agent) flown out of the ruptured microcapsules and the asorbent on the receiving sheet 8 react each other, thus, the green image is formed by mixing two colors.

Further, if only the yellow laser oscillator 53 is turned on and the cyan laser oscillator 51, the magenta laser oscillator 52 are turned off, the blue image is formed. And if the cyan laser oscillator 51, the magenta laser are turned on and the yellow laser oscillator 53 is turned off, the yellow image is formed since only the yellow microcapsules are ruptured. Similarly, the cyan image or the magenta image can be formed.

Furthermore, if all of the cyan laser oscillator 51, the magenta laser oscillator 52 and the yellow laser oscillator 53 are turned on, the white image originated in the white color of the receiving sheet 8 is formed because all microcapsules are not ruptured, On the contrary, all of the cyan laser oscillator 51, the magenta laser oscillator 52 and the yellow laser oscillator 53 are turned off, the black image is formed by mixing three colors because all microcapsules are ruptured.

Figure 27:
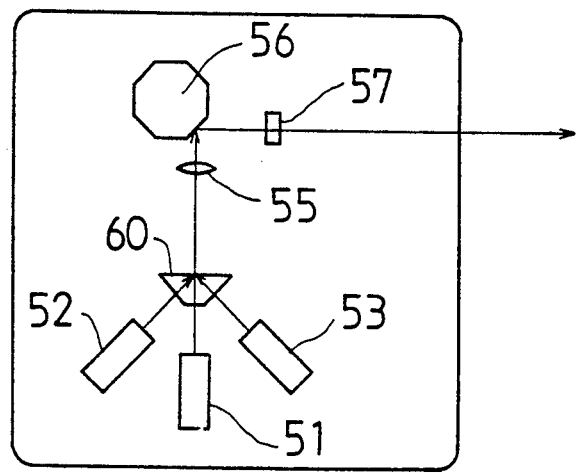
FIG. 27 is a partially schematic view of the laser scanning exposing device in which a polarizer such as a prism is utilized.

Next, the laser scanner shown in FIG. 27 will be described. In this laser scanner, the cyan laser oscillator 51, the magenta laser oscillator 52 and the yellow laser oscillator 53 are arranged similarly to the laser scanner shown in FIG. 26. The laser beam emitted from each laser oscillator passes through the polarizer such as a prism 60 and the polarized beam is collected into one light path and irradiated on the light scanning mirror 56 through the condenser lens 55. The image forming method is as same as that of the mentioned printer shown in FIG. 26, that is to say, the color image is formed on the receiving sheet 8 by controlling each laser oscillators based on the printing information or the image outputting information.

Figure 28:
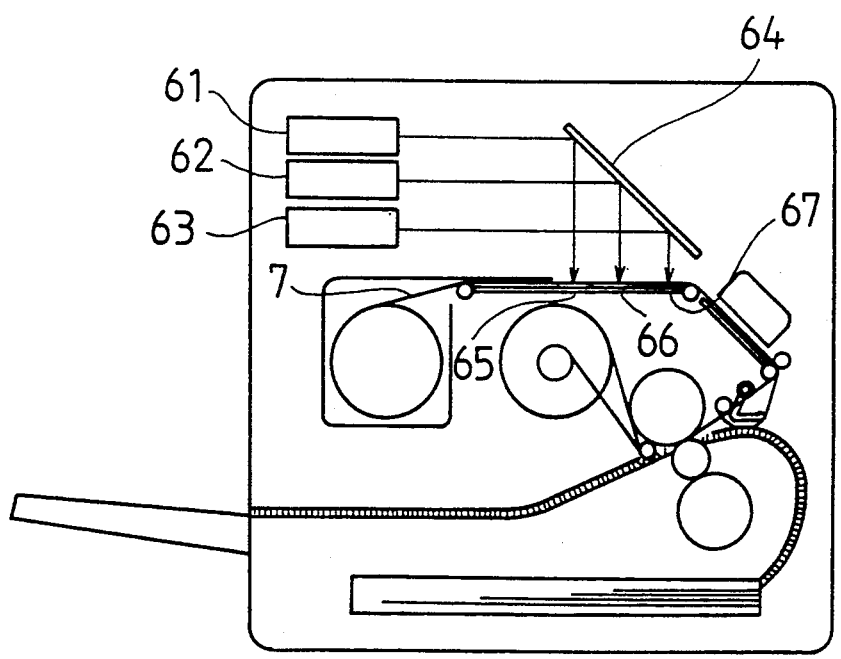
FIG. 28 is a whole schematic view of the apparatus of the present invention in which a reflection mirror for reflecting laser beam emitted from the laser scanning exposing device onto the microcapsule sheet.

Further, exposing method in the laser printer shown in FIG. 28 will be described hereinafter. In such laser printer, three laser scanners 61, 62, 63 are arranged therein. The laser beam emitted from each laser scanner is irradiated on the microcapsule sheet 7 through a reflecting mirror 64. In this laser printer, at first, the cyan oscillating scanner 61 emits the cyan sensitizing laser beam to a cyan exposing point 65 through the reflecting mirror 64. As a result, the cyan latent image is formed on the microcapsule sheet 7 at the point 65. And the magenta oscillating scanner 62 emits the m agenta sensitizing laser beam to a magenta exposing point 66 through the reflecting mirror 64 when the cyan latent image on the microcapsule sheet 7 reaches to the magenta exposing point 66. As a result, the magenta latent image is formed on the cyan latent image. Further, the yellow oscillating scanner 63 emits the yellow sensitizing laser beam to a yellow exposing point 67 through the reflecting mirror 64 when the cyan latent image and the magenta latent image reach to the yellow exposing point 67. As a result, the yellow latent image is formed on the cyan latent image and the magenta latent image. Therefore, the color latent image can be formed on the microcapsule sheet 7 while exposing the microcapsule sheet 7 in feeding thereof at constant speed.

Figure 29:
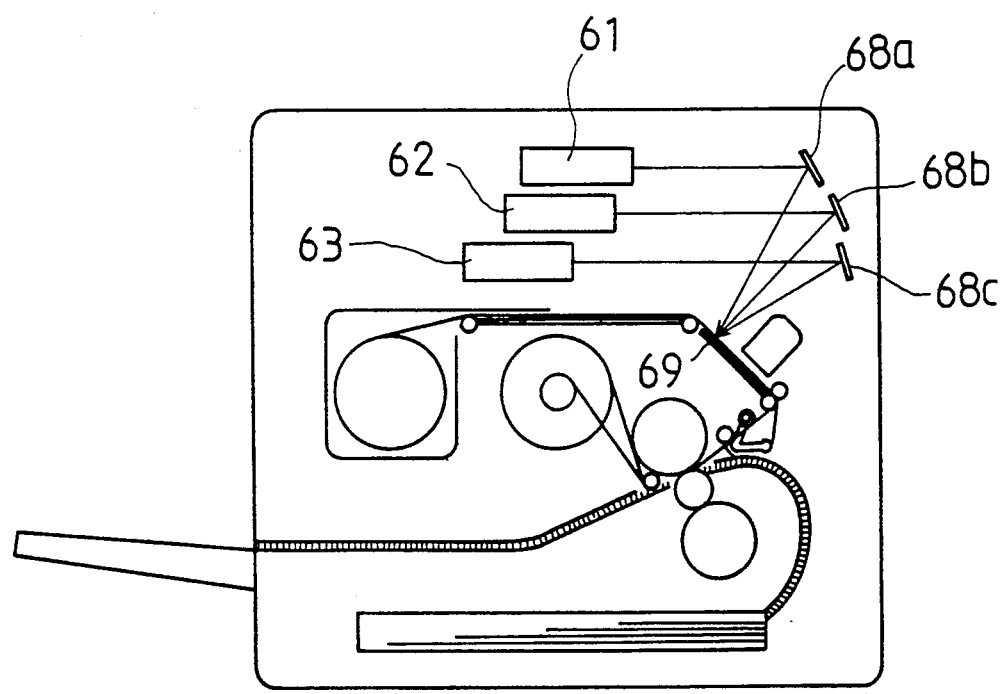
FIG. 29 is a whole schematic view of the apparatus of the present invention in which three reflection mirrors corresponding to three laser beams emitted from the laser scanning device respectively, are arranged.

Finally, the laser printer shown in FIG. 29 will be described. This printer has three laser scanners 61, 62, 63 to expose the cyan microcapsules, the magenta microcapsules and the yellow microcapsules, independently. The laser bea, synchronously emitted from each laser scanner 61, 62, 63 is spotted on a same exposing point 69 through reflecting mirrors 68a, 68b 68c. According to the laser printer mentioned above, the color latent image without color discord can be obtained since the light path of each laser beam with different wavelength can be voluntarily adjusted when the color latent image is formed on the microcapsule sheet 7 by using the laser beam with mutually different wavelength.

Here, it is possible to irradiate the laser beam directly to the exposing point by changing position or angle of each laser scanner though the exposing points are decided by polarizing the light path of the laser beam through the reflecting mirrors in the above embodiment.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An image recording apparatus in which an image is recorded on an image receiving sheet with use of photosensitive microcapsules, the microcapsules being photohardenable upon exposure and being hardened by heating, the image recording apparatus comprising:
    an exposing means for rendering the microcapsules on a photosensitive sheet hardenable upon exposing thereby,
    a heating means for forming a latent image on the photosensitive sheet by heating the hardenable microcapsules,
    a feeding means for feeding the photosensitive sheet to the image receiving sheet through a feeding path,
    a pressure means for developing the latent image on the image receiving sheet by pressurizing both the photosensitive sheet and the image receiving sheet in superposing the sheets each other,
    wherein the feeding means is located at a position downstream the heating means on the feeding path.

2. The image recording apparatus according to claim 1, wherein the exposing means comprises a light source and a liquid crystal display arranged near the feeding path, the liquid crystal display displaying an original image thereon and exposing the photosensitive sheet through the light source according to the original image.

3. The image recording apparatus according to claim 2, wherein the light source is a halogen lamp.

4. The image recording apparatus according to claim 3, further comprising a filter for cutting off infrared ray emitted from the halogen lamp, the filter being arranged between the liquid crystal display and the halogen lamp.

5. The image recording apparatus according to claim 4, further comprising three color filters of red color filter, green color filter and blue color filter, located between the infrared ray cutting filter and the liquid crystal display, each color filter being independently movable to a position under the infrared ray cutting off filter.

6. The image recording apparatus according to claim 2, wherein the liquid crystal display has a plurality of pixels, each pixel can selectively open and close.

7. The image recording apparatus according to claim 6, further comprising a liquid crystal display control means for controlling the pixels selectively so as to display the original image on the liquid crystal display.

8. The image recording apparatus according to claim 2, the light source is a fluorescent tube.

9. The image recording apparatus according to claim 8, wherein a couple of the fluorescent tubes are arranged at an upper position than the liquid crystal display and further comprises a scattering plate located between the fluorescent tubes to scatter light from the fluorescent tubes.

10. The image recording apparatus according to claim 9, further comprising a light shield plate located under the liquid crystal display so that the scattered light by the scattering plate does not irradiate the photosensitive sheet directly and a focusing lens mounted in the light shield plate to focus the original image of the liquid crystal display upon the photosensitive sheet.

11. The image recording apparatus according to claim 10, wherein the focusing lens has a zooming function.

12. The image recording apparatus according to claim 1, wherein the exposing means comprises a laser oscillating device to expose the photosensitive sheet by laser beam therefrom.

13. The image recording apparatus according to claim 12, wherein the microcapsules comprise a cyan microcapsule, a magenta microcapsule and a yellow microcapsule, each microcapsule being sensitized and rendered hardenable independently by laser beam with different wavelength each other and the laser oscillating device has three oscillators, each oscillator emitting the laser beam with different wavelength each other to irradiate each microcapsule independently.

14. An image recording apparatus in which an image is recorded on an image receiving sheet with use of photosensitive microcapsules, the microcapsules being photohardenable upon exposure and being hardened by heating, the image recording apparatus comprising:
    a light source,
    a liquid crystal display arranged near a feeding path, the liquid crystal display displaying an original image thereon and exposing the photosensitive sheet through the light source according to the original image,
    a feeding means for feeding the photosensitive sheet to the image receiving sheet through the feeding path, the feeding means being arranged downstream the light source, a pressure means for developing the latent image on the image receiving sheet by pressurizing both the photosensitive sheet and the image receiving sheet in superposing the sheets each other, a light path changing means to change a light path of a light from the light source so that the liquid crystal display is irradiated by the light from the light source, wherein the light source is located downstream the liquid crystal display and the photosensitive sheet is irradiated by a thermic ray emitted from the light source.

15. The image recording apparatus according to claim 1, wherein the heating means comprises a heater array located downstream the exposing means on the feeding path, the heater array having a plurality of microheaters arranged therein.

16. The image recording apparatus according to claim 15, further comprising a screen plate located between the heater array and the exposing means, so as to prevent heat emitted from the heater array from affecting the photosensitive sheet in the exposing means.

17. The image recording apparatus according to claim 15, wherein the exposing means comprises a liquid crystal display having a plurality of pixels and number of the pixels does not coincide with number of the microheaters arranged in the heater array.

18. The image recording apparatus according to claim 1, wherein the heating means comprises a heater where a plurality of heating elements are arranged in a line state with right angles to the feeding path, each heating element being contacted with the photosensitive sheet.

19. The image recording apparatus according to claim 1, wherein the photosensitive sheet comprises a conductive sheet, on one surface of which the microcapsules are applied, and the heating means comprises a plurality of electrode elements arranged in a line state, each electrode element being contacted with the other surface of the conducted sheet.

20. The image recording apparatus according to claim 19, wherein the conductive sheet includes carbon therein.

21. The image recording apparatus according to claim 1, wherein the heating means comprises a ceramic heater, a heating plate arranged oppositely to the ceramic heater in existing the photosensitive sheet therebetween and the photosensitive sheet is heated on the heating plate heated by the ceramic heater.

22. The image recording apparatus according to claim 21, wherein the ceramic heater is controlled so that surface temperature of the heating plate lies in temperature range of 100° C.-150° C.

23. The image recording apparatus according to claim 22, wherein the ceramic heater irradiates far-infrared ray onto the heating plate and wavelength of the far-infrared ray does not coincide with sensitive wavelength of the photosensitive sheet.

24. The image recording apparatus according to claim 1, wherein the heating means comprises a halogen heater, a heating plate arranged oppositely to the halogen heater in existing the photosensitive sheet therebetween and a glass plate with permeability of infrared ray arranged at an upper position of the photosensitive sheet and the photosensitive sheet is heated on the heating plate heated by the infrared ray passing through the glass plate.

25. The image recording apparatus according to claim 24, wherein the halogen heater is controlled so that surface temperature of the heating plate lies in temperature range of 100° C.-150° C.

26. The image recording apparatus according to claim 24, further comprising a reflector arranged over the heating plate so as to surround the halogen heater and a blower arranged in the reflector to compulsorily circulate heated air in the reflector.

27. The image recording apparatus according to claim 1, wherein the exposing means includes a liquid crystal display and the heating means comprises a plate heating element which is arranged oppositely to the liquid crystal display in existing the photosensitive sheet therebetween.

28. The image recording apparatus according to claim 27, wherein the plate heating element comprises a ceramic composite.

29. The image recording apparatus according to claim 27, wherein the plate heating element comprises a molded form made of magnesium oxide in which a nichrome wire is mounted.

30. The image recording apparatus according to claim 27, wherein the plate heating element is controlled so that surface temperature thereof lies in temperature range of 100° C.-160° C.

31. An image recording apparatus in which an image is recorded on an image receiving sheet with use of photosensitive microcapsules, the microcapsules being photohardenable upon exposure and being hardened by heating, the image recording apparatus comprising:

a halogen lamp, a liquid crystal display arranged near the feeding path, the liquid crystal display displaying an original image thereon and exposing the photosensitive sheet through the halogen lamp according to the original image a filter for cutting off infrared ray from the halogen lamp located between the halogen lamp and the liquid crystal display, a feeding means for feeding the photosensitive sheet to the image receiving sheet through a feeding path, a heat conductive plate arranged upstream the feeding means according to the feeding path, the heat conductive plate heating the photosensitive sheet by being heated through the infrared ray from the halogen lamp.

32. The image recording apparatus according to claim 31, wherein the heat conductive plate comprises a metal material with heat conductivity.

33. The image recording apparatus according to claim 32, wherein the metal material is made of aluminium or copper.

34. The image recording apparatus according to claim 1, wherein the heating means comprises a pair of guide rollers for guiding the photosensitive sheet, a plate heater arranged between the guide rollers and a driving mechanism of the plate heater to move the plate heater between a first position where the plate heater contacts with the photosensitive sheet and a second position where the plate heater separates form the photosensitive sheet.

35. The image recording apparatus according to claim 1, wherein the heating means comprises a pair of guide rollers for guiding the photosensitive sheet, a pair of heaters, each heater arranged under each guide roller, a dancer roller located between the guide rollers which is movable up and down between the heaters and the dancer roller moves the photosensitive sheet up and down according to movement thereof.

36. The image recording apparatus according to claim 1, wherein the photosensitive sheet comprises a clear base sheet with high light-permeability and the microcapsules applied thereon, and the exposing means is arranged at a side of a surface of the microcapsule sheet on which the microcapsules are not applied.

* * * * *